United States Patent
Soga et al.

(10) Patent No.: US 10,868,573 B2
(45) Date of Patent: Dec. 15, 2020

(54) ANTENNA INTEGRATED AMPLIFIER AND TRANSMITTER

(71) Applicant: FUJITSU LIMITED, Kawasaki (JP)

(72) Inventors: Ikuo Soga, Isehara (JP); Yoichi Kawano, Setagaya (JP)

(73) Assignee: FUJITSU LIMITED, Kawasaki (JP)

(*) Notice: Subject to any disclaimer, the term of this patent is extended or adjusted under 35 U.S.C. 154(b) by 0 days.

(21) Appl. No.: 16/581,819

(22) Filed: Sep. 25, 2019

(65) Prior Publication Data
US 2020/0127690 A1    Apr. 23, 2020

(30) Foreign Application Priority Data

Oct. 22, 2018 (JP) .............................. 2018-198527

(51) Int. Cl.
| | | |
|---|---|---|
| H01Q 11/12 | (2006.01) | |
| H04B 1/04 | (2006.01) | |
| H01Q 1/50 | (2006.01) | |
| H05K 1/18 | (2006.01) | |
| H03F 3/19 | (2006.01) | |

(52) U.S. Cl.
CPC ............. *H04B 1/0458* (2013.01); *H01Q 1/50* (2013.01); *H03F 3/19* (2013.01); *H05K 1/181* (2013.01); *H03F 2200/451* (2013.01); *H05K 2201/10378* (2013.01)

(58) Field of Classification Search
CPC .......... H04B 1/0458; H01Q 1/50; H03F 3/19; H03F 2200/451; H05K 1/181; H05K 2201/10378

USPC ........ 455/121, 193.1, 127.3, 194.2, 311, 341
See application file for complete search history.

(56) References Cited

U.S. PATENT DOCUMENTS

| | | | | |
|---|---|---|---|---|
| 6,326,922 B1* | 12/2001 | Hegendoerfer | .......... | H01Q 1/38 343/700 MS |
| 7,768,457 B2* | 8/2010 | Pettus | ..................... | H01L 23/66 343/700 MS |
| 8,138,599 B2* | 3/2012 | Megahed | ................ | H01L 25/16 257/723 |
| 8,502,735 B1* | 8/2013 | Moosbrugger | .......... | H01Q 3/30 343/700 MS |
| 10,515,924 B2* | 12/2019 | Babcock | ................. | H04B 1/40 |

FOREIGN PATENT DOCUMENTS

| | | |
|---|---|---|
| JP | 2007-184690 A | 7/2007 |
| WO | 2015/088486 A1 | 6/2015 |

* cited by examiner

*Primary Examiner* — Sonny Trinh
(74) *Attorney, Agent, or Firm* — Fujitsu Patent Center

(57) ABSTRACT

An antenna integrated amplifier includes a board configured to include an antenna, a radiator that faces the board, a first supporter interposed between the board and the radiator to support the board with respect to the radiator, and configured to include an amplifier to amplify a signal communicated by the antenna, a first bump interposed between the board and the first supporter to be electrically coupled to the antenna and the amplifier, a second supporter interposed between the board and the radiator to support the board with respect to the radiator, and a second bump interposed between the board and the second supporter.

11 Claims, 25 Drawing Sheets

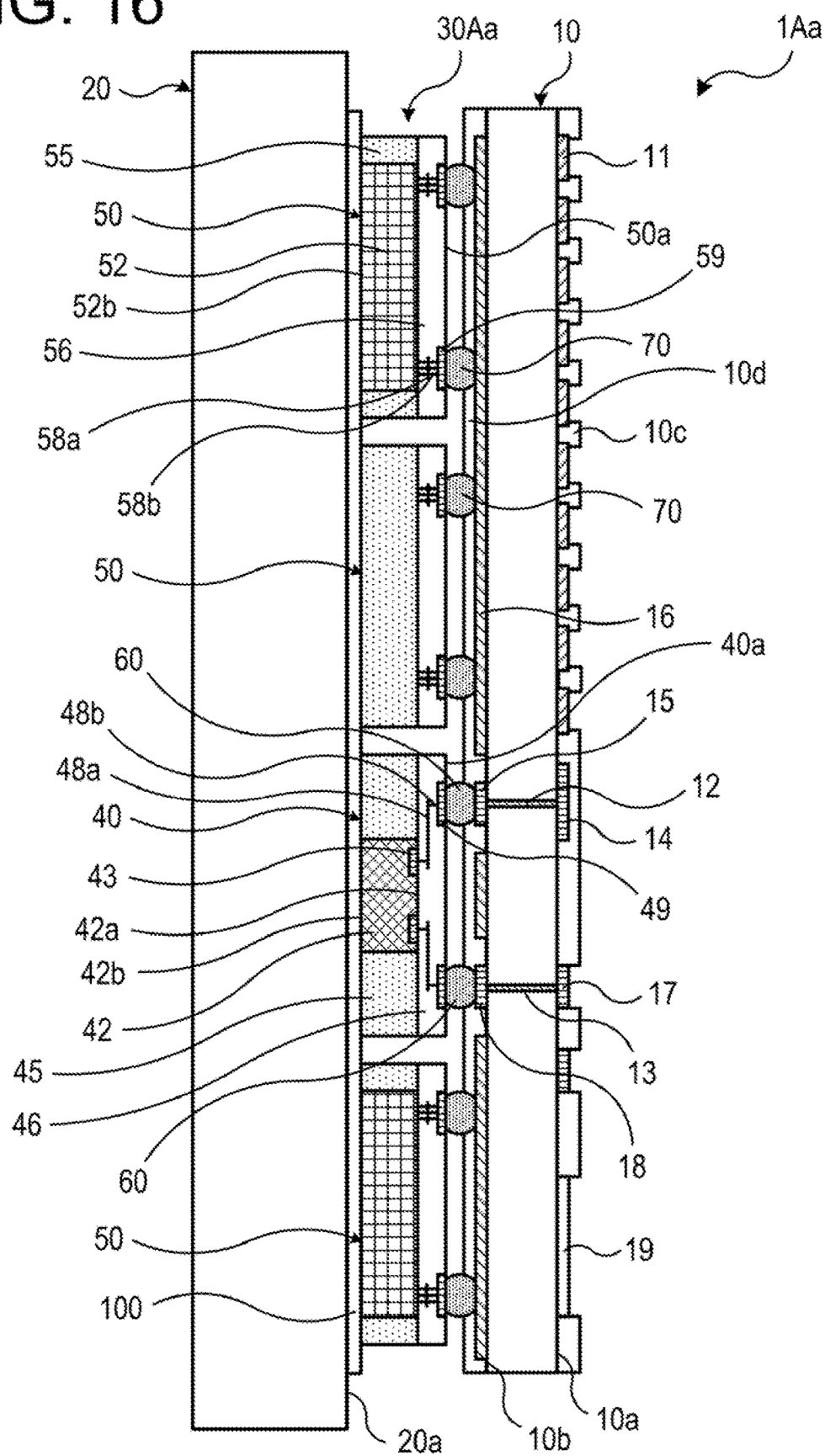

ANTENNA INTEGRATED AMPLIFIER AND TRANSMITTER

CROSS-REFERENCE TO RELATED APPLICATION

This application is based upon and claims the benefit of the prior Japanese Patent Application No. 2018-198527, filed on Oct. 22, 2018, the entire contents of which are incorporated herein by reference.

FIELD

The embodiments discussed herein are related to an antenna integrated amplifier and a transmitter.

BACKGROUND

As to a device used for communication, for example, a technology of providing an surface acoustic wave element having a comb electrode connected to each of the transmission side and the reception side of radio waves via bumps on a ceramic package of an antenna duplexer and a technology of providing a dummy bump along with the bumps described above are known. In addition, there is known a technology in which a package having a chip embedded in a mold compound and a package having an antenna formed on a ceramic board are stacked and connected through a solder ball or the like therebetween.

Related techniques are disclosed in, for example, Japanese Laid-open Patent Publication No. 2007-184690 and International Publication Pamphlet No. WO 2015/088486.

SUMMARY

According to an aspect of the embodiments, an antenna integrated amplifier includes a board configured to include an antenna, a radiator that faces the board, a first supporter interposed between the board and the radiator to support the board with respect to the radiator, and configured to include an amplifier to amplify a signal communicated by the antenna, a first bump interposed between the board and the first supporter to be electrically coupled to the antenna and the amplifier, a second supporter interposed between the board and the radiator to support the board with respect to the radiator, and a second bump interposed between the board and the second supporter.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 15A and 158 are views illustrating modifications of the antenna integrated amplifier according to the second embodiment;

FIG. 16 is a view (part 1) illustrating still another modification of the antenna integrated amplifier according to the second embodiment;

DESCRIPTION OF EMBODIMENTS

In a wireless communication device that transmits or receives a signal, an antenna is connected to an amplifier that amplifies a signal communicated by the antenna. For the connection between the antenna and the amplifier, for example, when using a method of connecting a board provided with the antenna to the amplifier through a bump, the connection distance between the board provided with the antenna and the amplifier is restrained, and the transmission loss of signals is restrained. However, in this method, the connection strength between the board provided with the antenna and the amplifier may not be sufficiently obtained, and thus, it may not be possible to connect the board and amplifier with high reliability.

Hereinafter, embodiments of a technology of connecting a board provided with an antenna and an amplifier through a bump with high reliability will be described in detail with reference to the accompanying drawings.

First Embodiment

Figure 1:
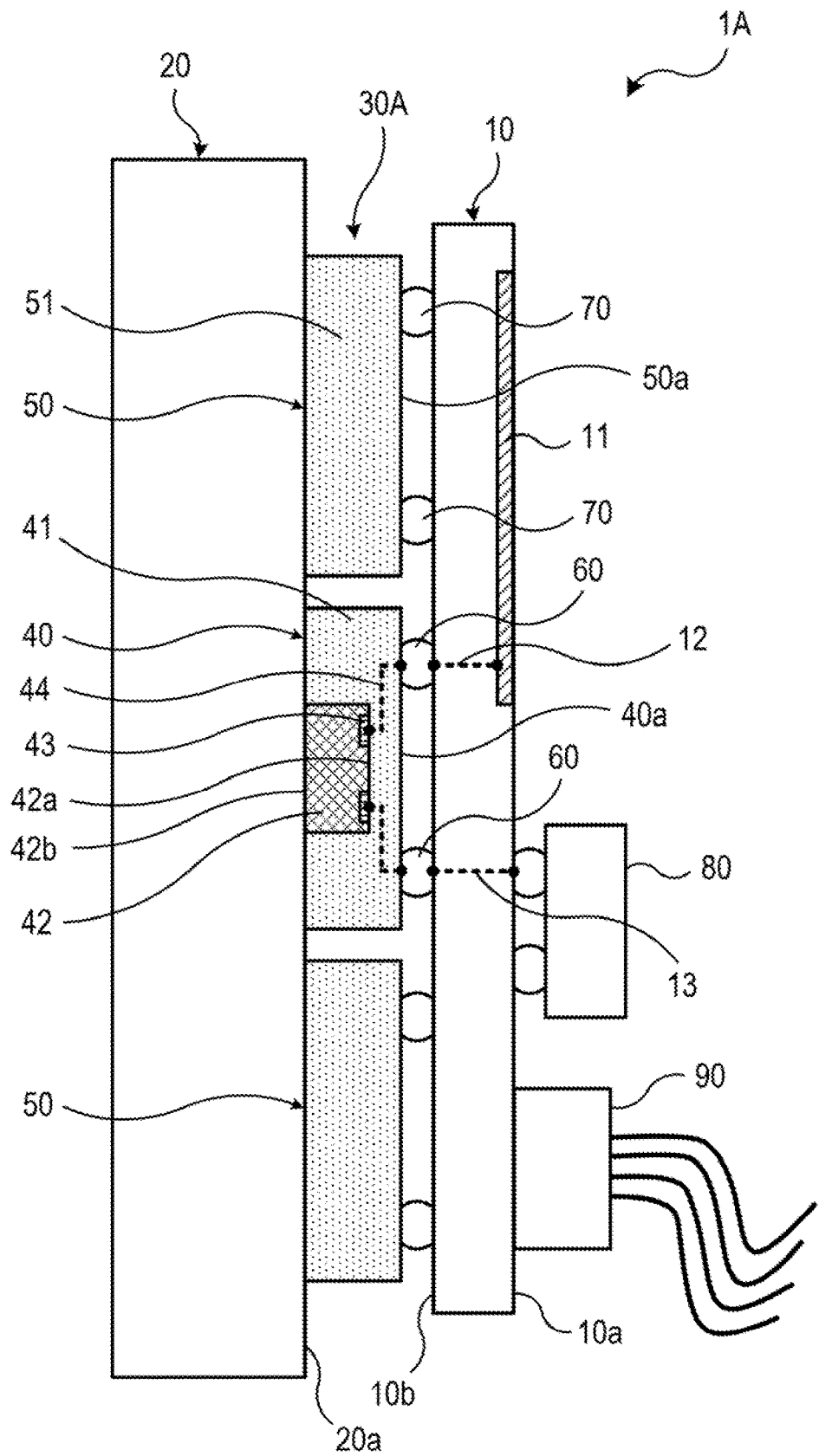
FIG. 1 is a view illustrating an example of an antenna integrated amplifier according to a first embodiment.

FIG. 1 is a view illustrating an example of an antenna integrated amplifier according to a first embodiment. FIG. 1 schematically illustrates a cross-sectional view of major parts of an example of an antenna integrated amplifier.

The antenna integrated amplifier 1A illustrated in FIG. 1 includes a board (antenna board) 10 having an antenna 11, a radiator 20 disposed to face the antenna board 10, and a support unit 30A interposed between the antenna board 10 and the radiator 20.

The antenna board 10 is a circuit board including an insulating portion and a conductor portion which is provided in a predetermined pattern inside the insulating portion and on a front surface 10a and a rear surface 10b. A portion of the conductor portion provided on the front surface 10a of the antenna board 10 functions as the antenna 11.

Various types of insulating materials may be used in the insulating portion of the antenna board 10. For example, a ceramic material having a relatively high dielectric constant such as aluminum oxide ($Al_2O_3$) or barium titanate ($BaTiO_3$) may be used in the insulating portion of the antenna board 10. In the insulating portion of the antenna board 10, a resin material such as epoxy resin or a polyimide resin or a material in which fibers or cloth of a glass material or a carbon material is contained in the resin material may be used instead of or in addition to the ceramic material.

Various types of conductor materials are used in the conductor portion of the antenna board 10. For example, a metal material such as copper (Cu) or aluminum (Al) may be used in the conductor portion of the antenna board 10. The same kinds or different kinds of conductor materials may be used in the antenna 11 and in the other conductor parts of the antenna board 10.

The radiator 20 is disposed such that a surface 20a thereof faces the rear surface 10b of the antenna board 10. Various types of conductor materials are used in the radiator 20. For example, a metal material having a relatively good thermal conductivity such as Cu or Al may be used in the radiator. In the radiator 20, for example, a ceramic material such as aluminum nitride (AlN) or a carbon material such as graphene or carbon nanotube, which has relatively good thermal conductivity, may be used instead of or in addition to the metal material. The radiator 20 may be provided with fins each having a needle shape, a plate shape, a corrugated plate shape, or the like. When the radiator 20 is also used as a ground (GND), a material having electrical conductivity may be used as the conductor material.

The support unit 30A is interposed between the antenna board 10 (the rear surface 10b thereof) and the radiator 20 (the surface 20a thereof). The support unit 30A includes at least one (one in the example of FIG. 1 in the cross-sectional view) amplification module 40 disposed to face a portion of the antenna board 10 and at least one (two in the example of FIG. 1 in the cross-sectional view) support module 50 disposed to face another portion of the antenna board 10. The support unit 30A further includes a bump 60 provided on a surface 40a of the amplification module 40 facing the rear surface 10b of the antenna board 10 and a bump 70 provided on a surface 50a of the support module 50 facing the rear surface 10b of the antenna board 10.

The amplification module 40 includes a package 41 in which a resin material or the like is used and at least one (one in the example of FIG. 1 in the cross-sectional view) amplifier 42 provided in the package 41. Although not illustrated here, the package 41 is provided with a pad to which the bump 60 is bonded. As the amplifier 42, a semiconductor device such as a semiconductor chip or a semiconductor package having a function of amplifying and outputting an input signal is used. The amplification module 40 is a portion that faces a portion of the antenna board 10 and has a function of amplifying a signal by the amplifier 42 and a function of supporting the antenna board 10 along with the bump 60 provided on the surface 40a thereof as described later.

For example, a semiconductor device including a complementary metal oxide semiconductor (CMOS) transistor using silicon (Si) as a semiconductor material in an amplification circuit is used for the amplifier 42. Alternatively, a semiconductor device including a transistor using a silicon germanium (SiGe) based or gallium arsenide (GaAs) based compound semiconductor material in an amplification circuit is used for the amplifier 42. Still alternatively, a semiconductor device including a high electron mobility transistor (HEMT) using a gallium nitride (GaN) based compound semiconductor material, a so-called GaN-HEMT, in an amplification circuit is used for the amplifier 42. For example, in the antenna integrated amplifier 1A used in a transmitter for long distance wireless communication in the 28 GHz band, a GaN-HEMT is used for the amplifier 42.

The amplifier 42 has a terminal 43 provided on a front surface 42a thereof. The terminal 43 of the amplifier 42 is connected to a conductor portion 44 (illustrated by a dotted line in FIG. 1) provided in the package 41. The conductor portion 44 is connected to the bump 60 provided on the surface 40a of the amplification module 40, and the terminal 43 is electrically connected to the bump 60 through the conductor portion 44. The amplifier 42 is provided, for example, such that a rear surface 42b on the side (radiator 20 side) opposite to the front surface 42a on which the terminal 43 is provided is exposed from the package 41. The amplifier 42 having the rear surface 42b exposed from the package 41 is thermally connected to the radiator 20. Further, when the radiator 20 is used as a GND, the amplifier 42 having the rear surface 42b exposed from the package 41 is electrically connected to the radiator 20.

The support module 50 includes a package 51 in which a resin material or the like is used. Although not illustrated here, the package 51 is provided with a pad to which the bump 70 is bonded. In the package 51 of the support module 50, a member having certain rigidity such as a metal chip to be described later may be provided, or such a member may not be provided. The support module 50 is a portion that faces the other portion of the antenna board 10 different from the portion which faces the amplification module 40 and has a function of supporting the antenna board 10 along with the bump 70 provided on the surface 50a as described later.

The support module 50 is sized such that the distance from the surface 50a thereof to the surface 20a of the radiator 20 (height or thickness) is the same as or equivalent to the distance from the surface 40a of the amplification module 40 to the surface 20a of the radiator 20 (height or thickness). For example, the package 51 having a size in which the difference between the aforementioned distances is 10 µm or less, preferably 5 µm or less is used. Alternatively, the support module 50 is sized such that the distance from the surface 50a thereof to the rear surface 10b of the antenna board 10 is the same as or equivalent to the distance from the surface 40a of the amplification module 40 to the rear surface 10b of the antenna board 10. For example, the package 51 having a size in which the difference between the aforementioned distances is 10 µm or less, preferably 5 µm or less is used.

For example, a solder material is used in the bump 60 and the bump 70. In this case, the bump 60 and the bump 70 are formed, for example, by reflowing a solder ball or solder paste. The bump 60 and the bump 70 may not necessarily have a ball shape or a substantially ball shape as illustrated in FIG. 1 as long as they have a certain height. In the bump 60 and the bump 70, a columnar electrode such as a pillar electrode or a post electrode formed using a conductor material such as Cu, nickel (Ni), or gold (Au) may be used instead of or in addition to the solder material.

In the antenna integrated amplifier 1A illustrated in FIG. 1, the amplification module 40 and the support module 50 are arranged separately from each other so as to face different portions of the antenna board 10. The antenna integrated amplifier 1A includes, as the support unit 30A, an assembly of the amplification module 40 and the bump 60 provided on the surface 40a thereof and the support module 50 and the bump 70 provided on the surface 50a thereof. In the antenna integrated amplifier 1A, the antenna board 10 is supported with respect to the radiator 20 by such a support unit 30A.

The antenna board 10 has a conductor portion 12 (illustrated by a dotted line in FIG. 1) which interconnects the antenna 11 and the bump 60 on the surface 40a of the amplification module 40. The amplifier 42 of the amplification module 40 is electrically connected to the antenna 11 through the terminal 43, the conductor portion 44 in the package 41, the bump 60 on the surface 40a, and the conductor portion 12 of the antenna board 10.

Further, for example, as illustrated in FIG. 1, a semiconductor device 80 may be mounted on the antenna board 10, and a connector 90 may be connected to the antenna board 10. For example, the amplifier 42 of the amplification module 40 is electrically connected to the semiconductor device 80 or the connector 90 through the terminal 43, the conductor portion 44 in the package 41, the bump 60 on the surface 40a, and a conductor portion 13 of the antenna board 10 (illustrated by a dotted line in FIG. 1). FIG. 1 illustrates an example in which the amplifier 42 of the amplification module 40 is electrically connected to the antenna 11 of the antenna board 10 and the semiconductor device 80 mounted on the antenna board 10. For example, as for the semiconductor device 80, a device having functions of a baseband circuit 210, an up-converter 220, an oscillator 230, a phase shifter 240, and the like of a transmitter 200 (FIG. 2) as described later may be connected to the antenna board 10. Alternatively, another device having the functions of the baseband circuit 210, the up-converter 220, the oscillator 230, the phase shifter 240, and the like of the transmitter 200 (FIG. 2) as described later may be connected to the antenna board 10 using the connector 90.

The antenna integrated amplifier 1A having the above-described configuration may be used in a wireless communication device (e.g., transmitter or receiver) that transmits or receives a signal. As an example, a case where the antenna integrated amplifier 1A is used in a transmitter will be described.

Figure 2:
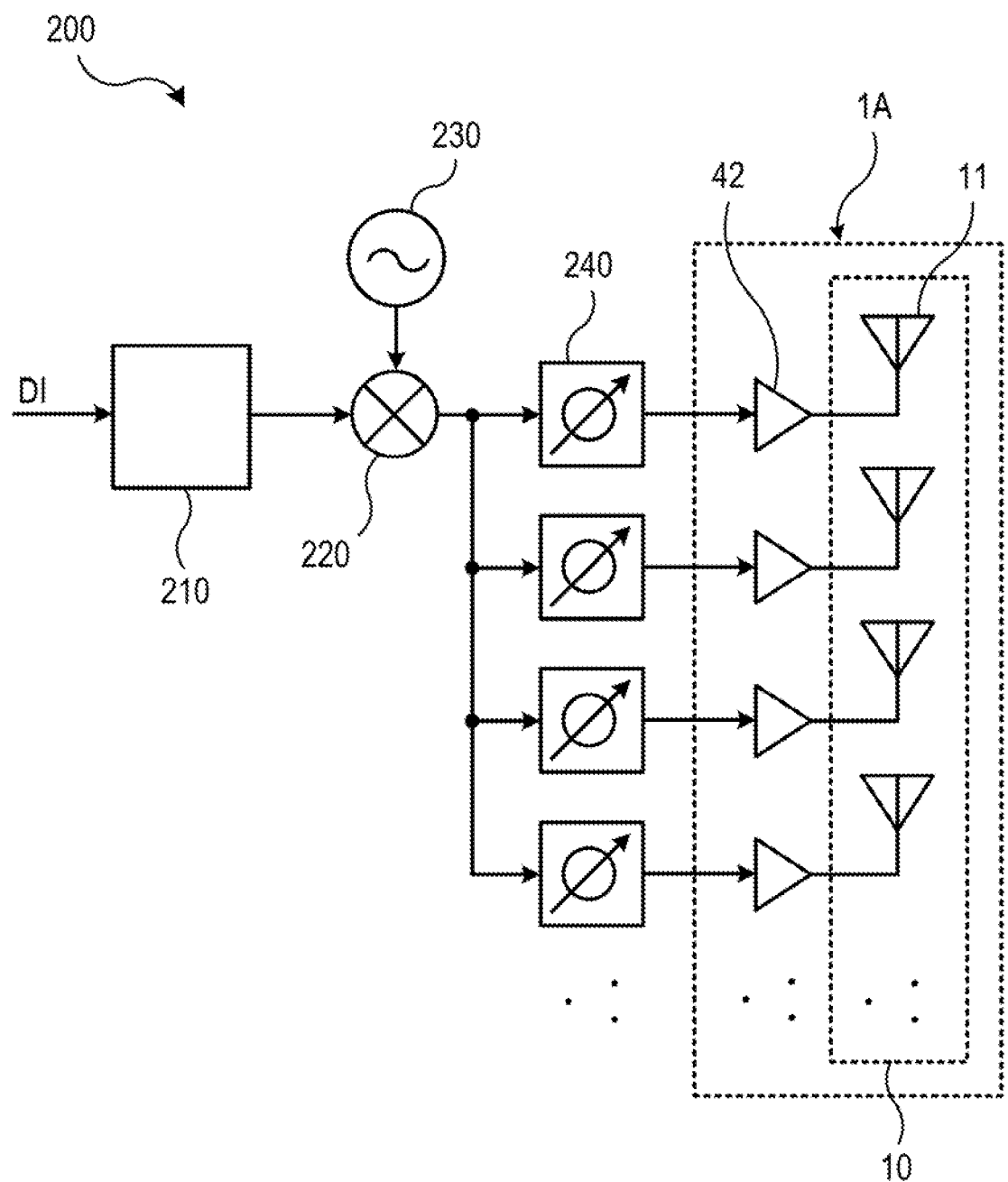
FIG. 2 is a view illustrating an example of a transmitter circuit using the antenna integrated amplifier according to the first embodiment.

FIG. 2 is a view illustrating an example of a transmitter circuit using the antenna integrated amplifier according to the first embodiment. FIG. 2 illustrates an example of a circuit of the transmitter 200 including a phased array antenna using the antenna integrated amplifier 1A. The transmitter 200 is used, for example, for a long distance (more than 1 km) wireless communication in the millimeter wave band or the quasi-millimeter wave band.

The transmitter 200 illustrated in FIG. 2 includes a baseband circuit 210, an up-converter 220, an oscillator 230, a phase shifter 240, and an antenna integrated amplifier 1A. Here, the antenna integrated amplifier 1A includes a plurality of antennas 11 arranged in an array shape on the antenna board 10 and a plurality of amplifiers 42 connected to the plurality of antennas 11. Although not illustrated here, not only one antenna 11 but also a group of two or more antennas 11 may be connected to a single amplifier 42. The transmitter 200 includes a plurality of phase shifters 240, and the plurality of phase shifters 240 are respectively connected to the plurality of amplifiers 42 of the antenna integrated amplifier 1A.

Moreover, the antenna integrated amplifier 1A used in the transmitter 200 as illustrated in FIG. 2 may include, for example, a plurality of amplification modules 40 in which the plurality of amplifiers 42 are provided one by one inside the package 41 illustrated in FIG. 1. Alternatively, the antenna integrated amplifier 1A used in the transmitter 200 illustrated in FIG. 2 may include one or more amplification modules 40 in which two or more (or all) amplifiers 42 are provided inside one package 41 illustrated in FIG. 1.

In the transmitter 200 illustrated in FIG. 2, when data DI (digital signal) to be transmitted is input to the baseband circuit 210, the baseband circuit 210 generates a baseband signal (analog signal) based on the data DI. The up-converter 220 multiplies an oscillation signal generated by the oscillator 230 by the baseband signal generated by the baseband circuit 210 to convert (up-convert) the baseband signal into a signal of a predetermined frequency. The signal converted by the up-converter 220 is distributed to each of the plurality of phase shifters 240. Each phase shifter 240 adjusts the phase of the input signal and outputs a signal the phase of which has been shifted by a certain angle. The signal output from each phase shifter 240 is input to a corresponding one of the amplifiers 42. Each amplifier 42 amplifies the input signal and outputs the signal to a corresponding one of the antennas 11 (or a group of the antennas 11). The signal input to each antenna 11 (or a group of the antennas 11) is radiated to a space from each antenna 11 (or a group of the antennas 11) and is transmitted as a beam-formed radio signal.

Figure 3:
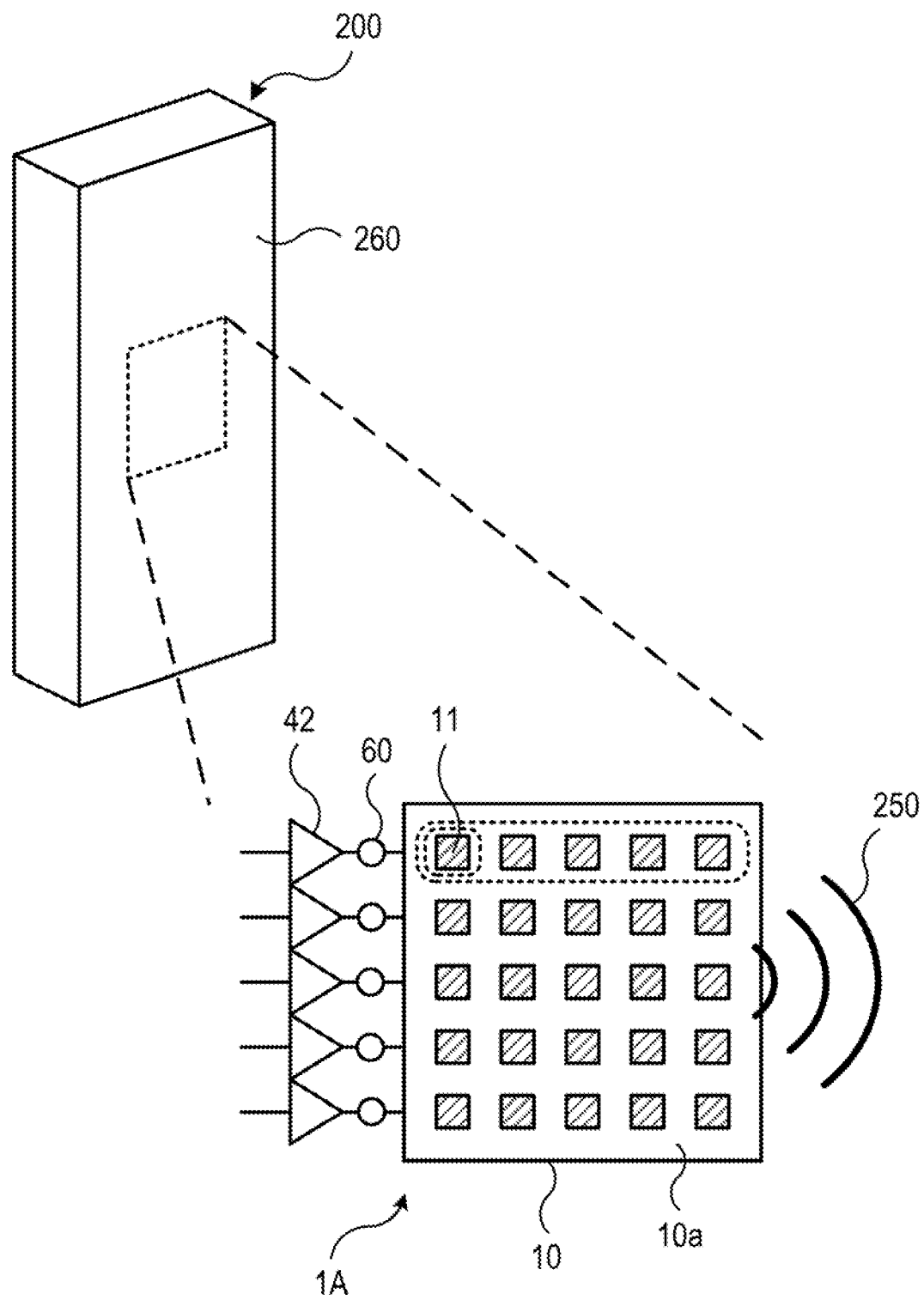
FIG. 3 is a view for explaining a transmitter using the antenna integrated amplifier according to the first embodiment.

FIG. 3 is a view for explaining a transmitter using the antenna integrated amplifier according to the first embodiment. FIG. 3 schematically illustrates an external view of major parts of a transmitter and a partially enlarged view thereof. The transmitter 200 illustrated in FIG. 3 has a configuration in which the circuit illustrated in FIG. 2 is mounted in a housing 260 so as to transmit or receive a wireless signal 250 from the plurality of antennas 11.

The antenna integrated amplifier 1A used in the transmitter 200, as illustrated in FIG. 1, includes the amplification module 40 having the amplifier 42, and the amplifier 42 is electrically connected to the antenna 11 through the bump 60 provided on the surface 40a.

In the transmitter 200 illustrated in FIGS. 2 and 3, the plurality of amplifiers 42 and the plurality of antennas 11 are used. As illustrated in FIG. 3, a signal of each amplifier 42 is transmitted to an individual antenna 11 or a unit of multiple antennas 11 (each illustrated by a dotted line) arranged in an array shape on the front surface 10a of the antenna board 10. When electrical connection between the amplifier 42 and the antenna 11 is made using the bump 60 illustrated in FIGS. 1 and 3, the connection distance between the amplifier 42 and the antenna 11 may be reduced compared to a case where the electrical connection is made using a cable and the like.

Figure 4:
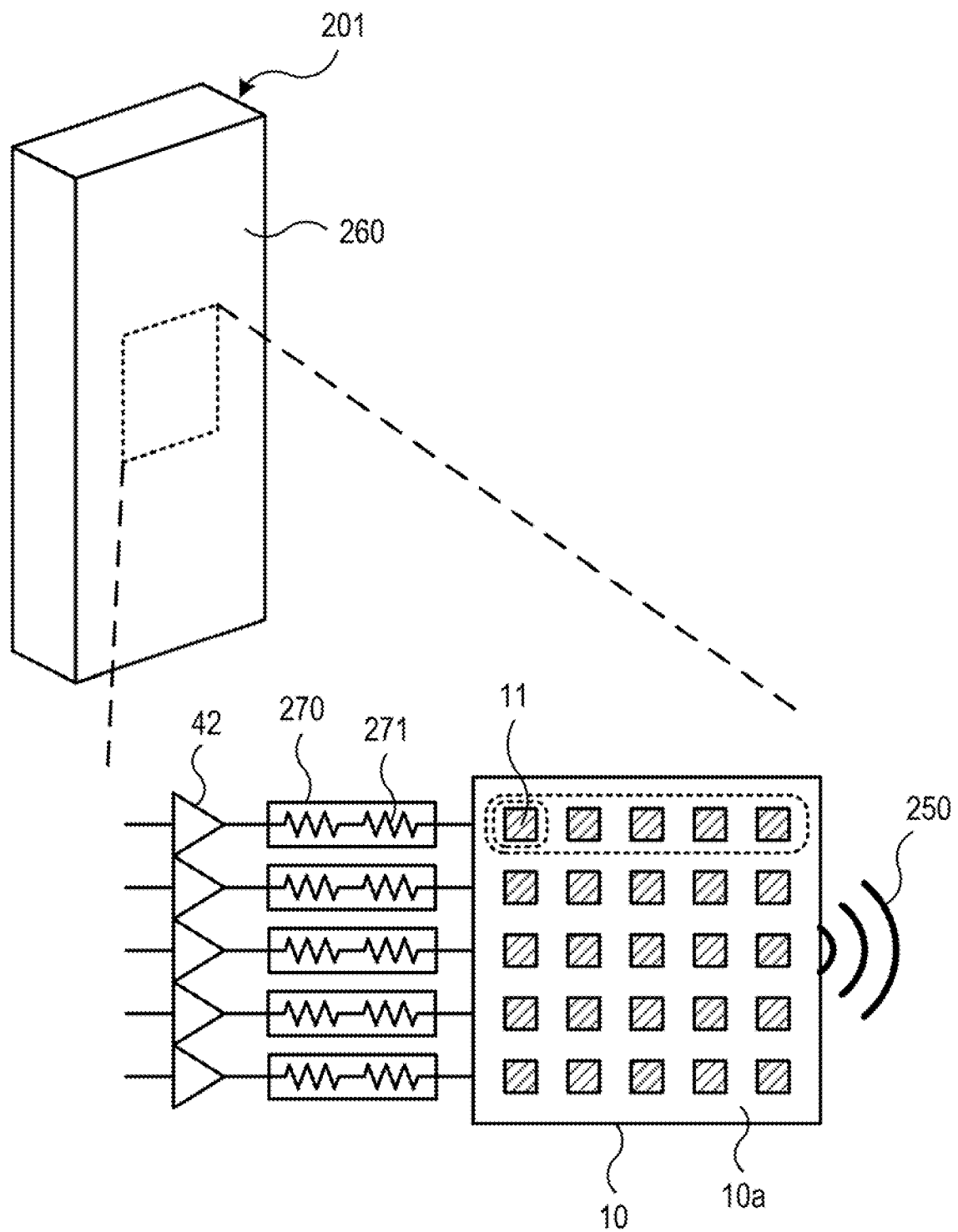
FIG. 4 is a view illustrating an example of a transmitter in which an antenna and an amplifier are electrically connected using a cable.

Here, for comparison, an example of a transmitter in which an antenna and an amplifier are electrically connected using a cable is illustrated in FIG. 4. FIG. 4 schematically illustrates an external view of major parts of a transmitter and a partially enlarged view thereof.

The transmitter 201 illustrated in FIG. 4 includes the plurality of amplifiers 42 and the plurality of antennas 11, and has a configuration in which a signal of each amplifier 42 is transmitted to an individual antenna 11 or a unit of multiple antennas 11 (each illustrated by a dotted line) through a cable 270. When the cable 270 is used for electrical connection between the amplifier 42 and the antenna 11 as in the transmitter 201, the loss of signals and power is increased by a resistance 271 of the cable 270, and thus, the communication quality of the wireless signal 250 may be deteriorated, and the power consumption of the amplifier 42 may be increased.

Meanwhile, when the amplifier 42 and the antenna 11 are electrically connected using the bump 60 as in the antenna integrated amplifier 1A (FIGS. 1 to 3), the connection distance between the amplifier 42 and the antenna 11 is reduced. A reduction in the connection distance between the amplifier 42 and the antenna 11 suppresses the loss of signals and power transmitted between them, thereby suppressing deterioration in communication quality and an increase in the power consumption of the amplifier 42. Furthermore, in the antenna integrated amplifier 1A, since an increase in the power consumption of the amplifier 42 is suppressed as described above, the generation of heat in the amplifier 42 under an operation is suppressed. Since the generation of heat in the amplifier 42 is suppressed, the radiator 20 (FIG. 1) connected thermally to the amplifier 42 may be miniaturized, and thus, the transmitter 200 (FIG. 3) including the antenna integrated amplifier 1A may be miniaturized.

Further, in the antenna integrated amplifier 1A (FIG. 1), the antenna board 10 is supported with respect to the radiator 20 by the amplification module 40 including the amplifier 42 and the bump 60 provided thereon and is supported by the support module 50 and the bump 70 provided thereon. Therefore, the antenna board 10 is stably held with respect to the radiator 20.

Figure 5:
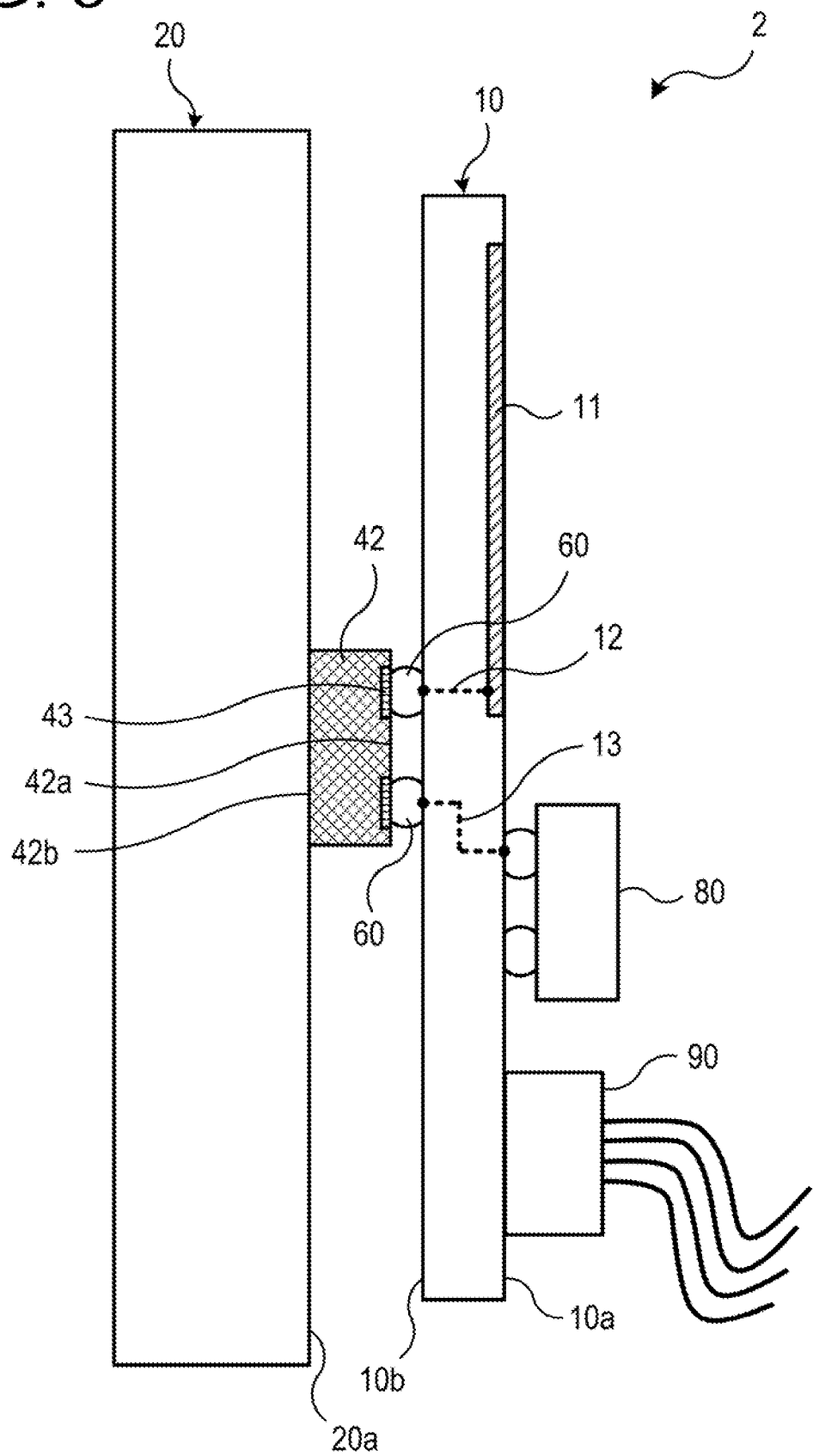
FIG. 5 is a view illustrating an example of an antenna integrated amplifier in which an antenna board is supported by an amplifier.

Here, for comparison, an example of an antenna integrated amplifier in which an antenna board is supported by an amplifier is illustrated in FIG. 5. FIG. 5 schematically illustrates a cross-sectional view of a major part of an example of an antenna integrated amplifier.

The antenna integrated amplifier 2 illustrated in FIG. 5 is different from the aforementioned antenna integrated amplifier 1A in that the antenna board 10 of the antenna integrated amplifier 2 is supported with respect to the radiator 20 only by the amplifier 42 and the bump 60 provided on the terminal 43 thereof.

In the antenna integrated amplifier 2 illustrated in FIG. 5, it is difficult to stably hold the antenna board 10 because the antenna board 10 having a relatively large size is supported by the amplifier 42 having a relatively small size and the bump 60 provided thereon. For example, even if a relatively small impact is applied to the antenna board 10, a crack or disconnection may occur in the bump 60 which is a connection portion between the antenna board 10 and the amplifier 42, and the transmission of signals and power between the amplifier 42 and the antenna 11 may not be properly performed. In the antenna integrated amplifier 2 illustrated in FIG. 5, sufficient connection reliability between the antenna board 10 and the amplifier 42 may not be obtained.

With respect to the antenna integrated amplifier 2 illustrated in FIG. 5, a method of screwing the antenna board 10 to the radiator 20 is also conceivable. However, since the amplifier 42 is generally provided with a plurality of bumps 60, it is difficult to screw the antenna board 10 to the radiator 20 while suppressing load from being unevenly applied to the plurality of bumps 60. When load is unevenly applied to the plurality of bumps 60, a crack or disconnection may occur in some of the bumps 60, and the transmission of signals and power between the amplifier 42 and the antenna 11 may not be properly performed, so that sufficient connection reliability between the antenna board 10 and the amplifier 42 may not be obtained.

Meanwhile, in the antenna integrated amplifier 1A (FIG. 1), a portion of the antenna board 10 which is different from the portion supported by the amplification module 40 including the amplifier 42 and the bump 60 provided thereon is supported by the support module 50 and the bump 70 provided thereon. As described above, in the antenna integrated amplifier 1A, the antenna board 10 is supported by the amplification module 40 including the amplifier 42 and the bump 60 and is also supported by the support module 50 and the bump 70. Therefore, the antenna board 10 is stably held with respect to the radiator 20. The antenna integrated amplifier 1A with high connection reliability between the antenna board 10 and the amplifier 42 is realized.

For example, in one example of the antenna integrated amplifier 1A, the amplification module 40 and the support module 50 may be disposed in an area about 10 times the area of the amplifier 42, and the supporting strength of the antenna board 10 may be approximately 10 times compared to a case where only the amplifier 42 is provided (FIG. 5).

Second Embodiment

Here, an example to which the configuration of the antenna integrated amplifier 1A as described in the first embodiment is applied will be described as a second embodiment.

Figure 6:
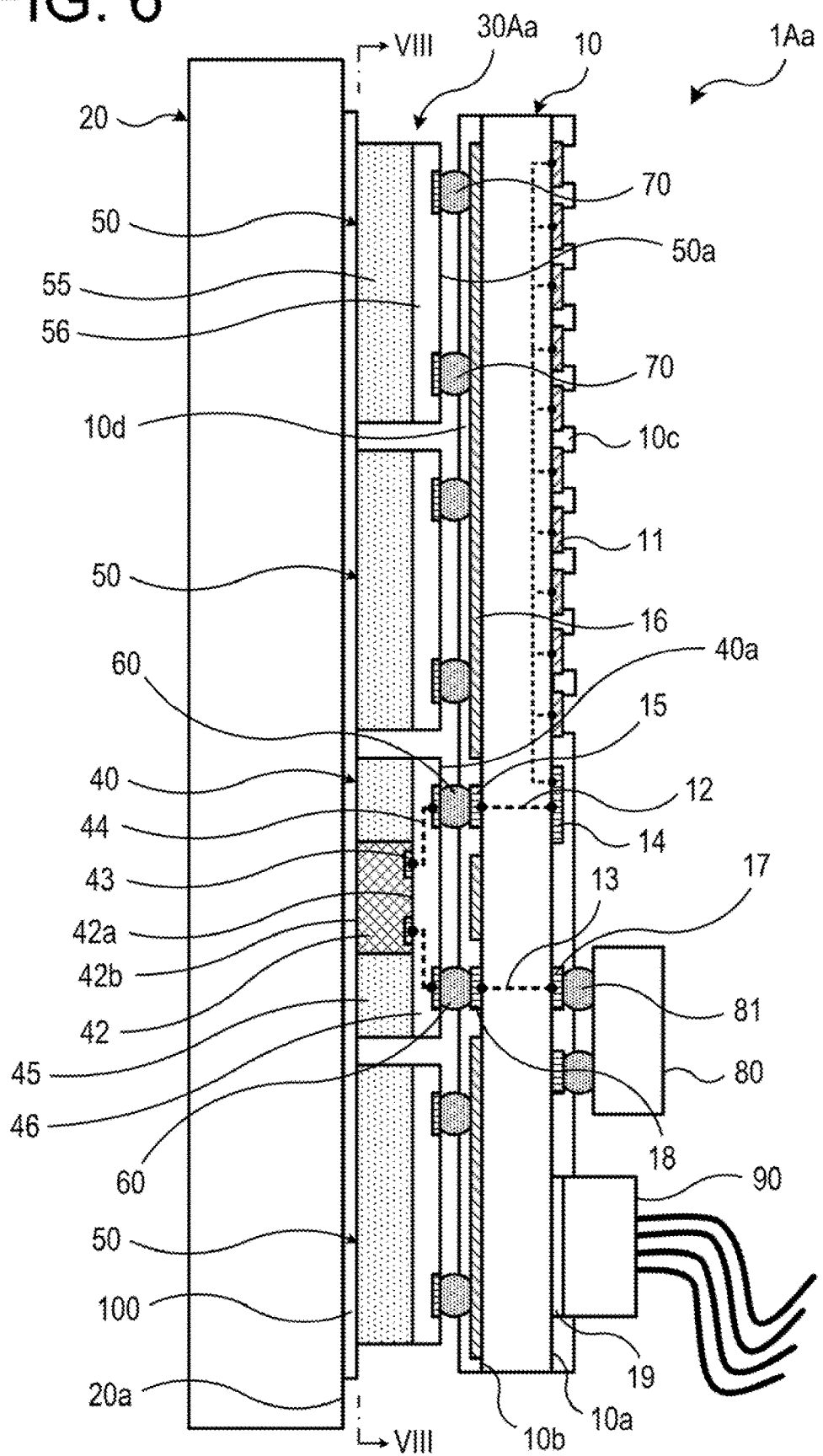
FIG. 6 is a view illustrating an example of an antenna integrated amplifier according to a second embodiment.
Figure 7A:
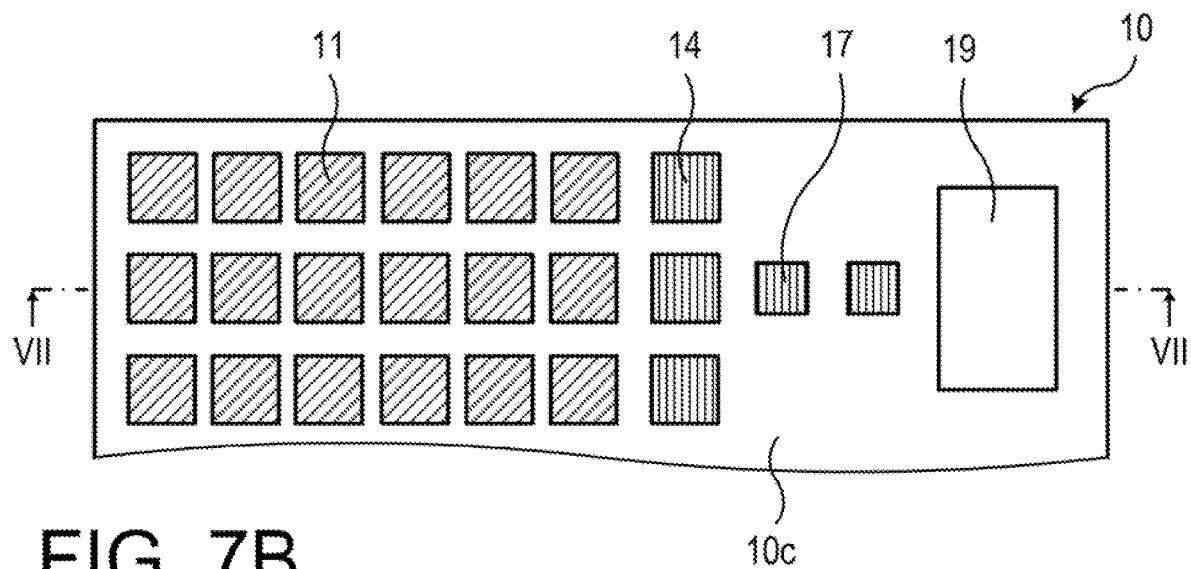
FIGS. 7A to 7C are views illustrating an example of an antenna board of the antenna integrated amplifier according to the second embodiment.
Figure 7B:
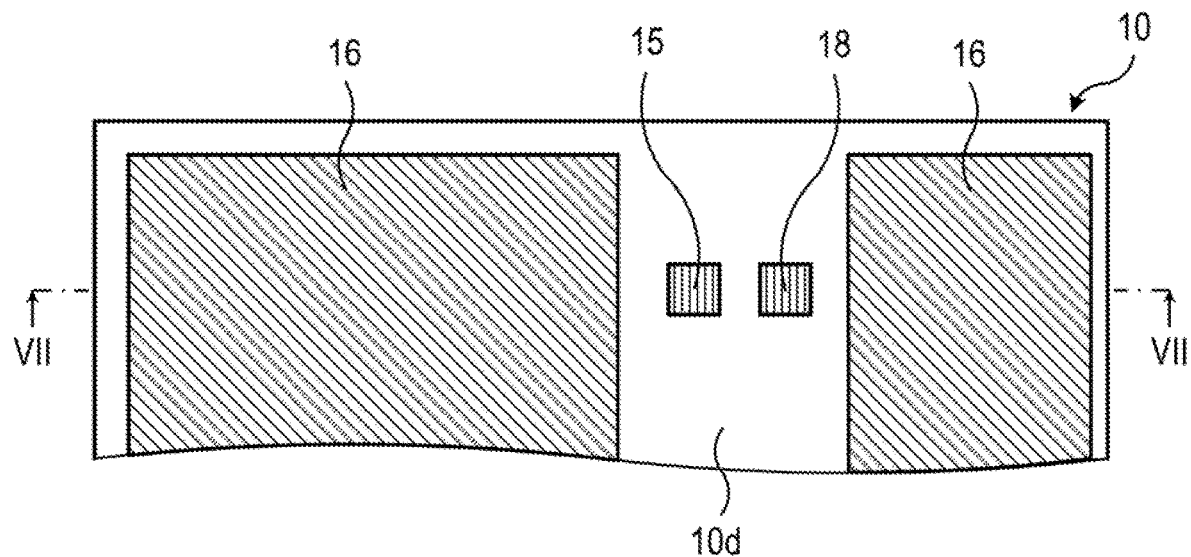
Figure 7C:
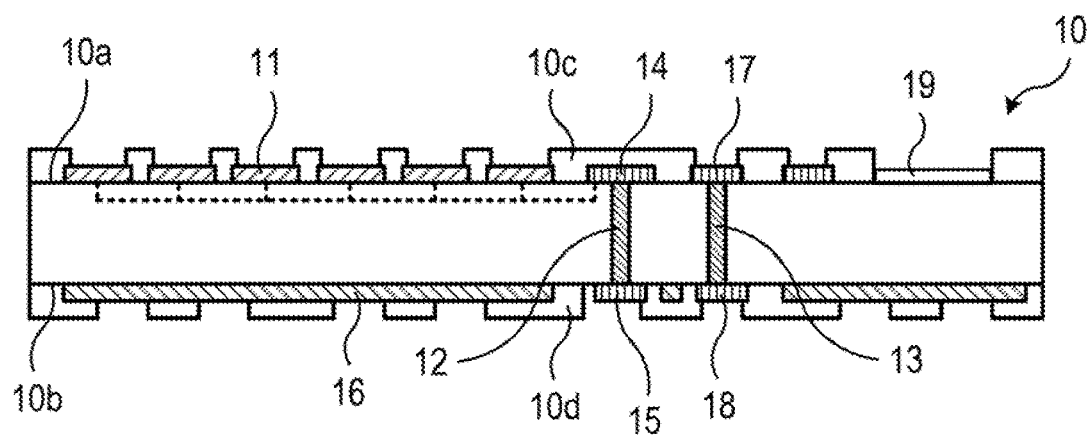
Figure 8:
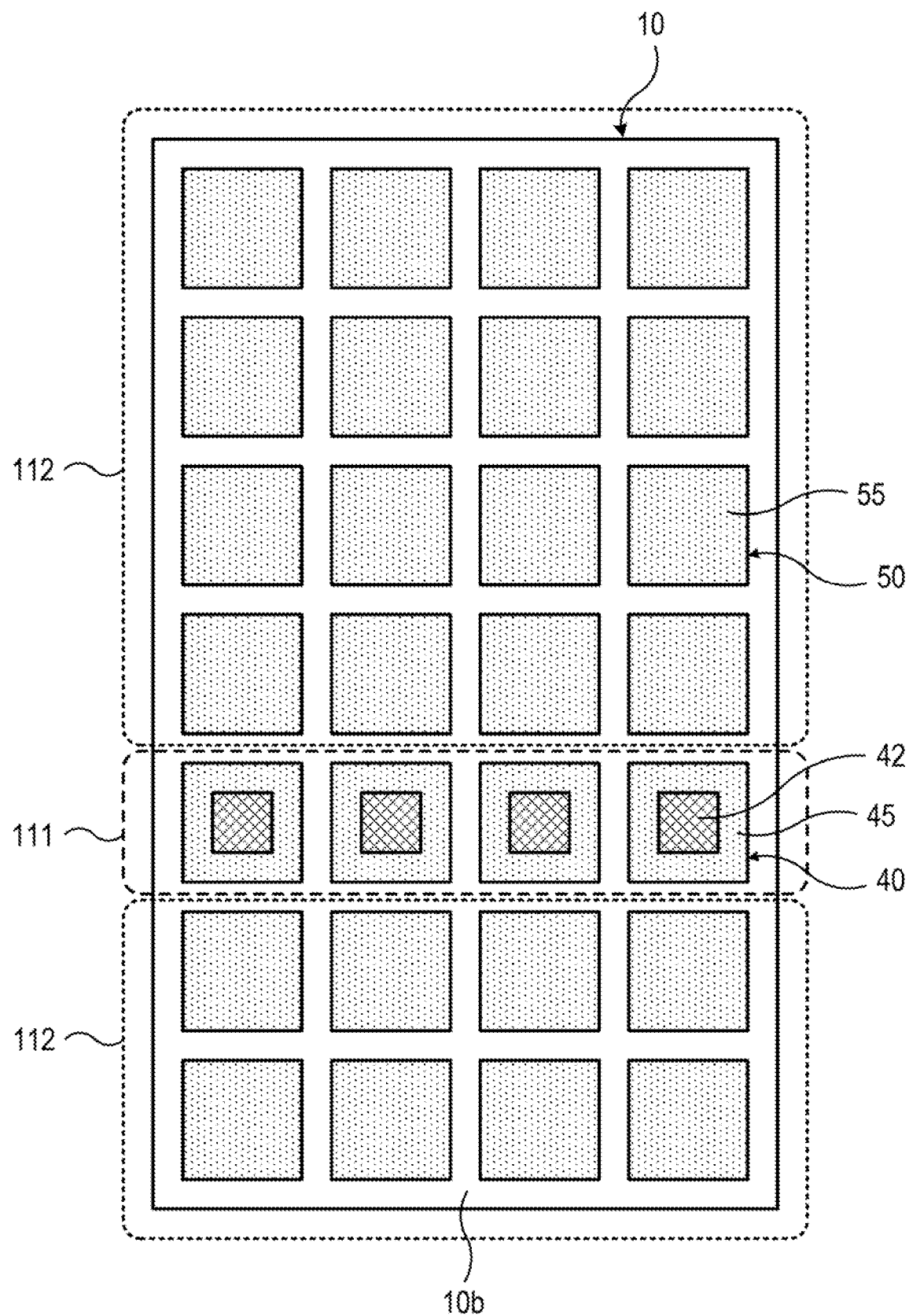
FIG. 8 is a view illustrating an example of an arrangement relationship between the antenna board and a support unit of the antenna integrated amplifier according to the second embodiment.

FIG. 6 is a view illustrating an example of an antenna integrated amplifier according to a second embodiment. FIG. 6 schematically illustrates a cross-sectional view of major parts of an example of an antenna integrated amplifier. Further, FIGS. 7A to 7C are views illustrating an example of an antenna board of the antenna integrated amplifier according to the second embodiment. FIG. 7A schematically illustrates a plan view of major parts of an example of an antenna board as viewed from the antenna side, FIG. 7B schematically illustrates a plan view of major parts of the example of the antenna board as viewed from the GND layer side, and FIG. 7C schematically illustrates a cross-sectional view taken along the direction of arrows VII-VII in FIGS. 7A and 7B. Further, FIG. 8 is a view illustrating an example of an arrangement relationship between the antenna board and a support unit of the antenna integrated amplifier according to the second embodiment. FIG. 8 schematically illustrates a plan view taken along the direction of arrows VIII-VIII in FIG. 6. An example of the antenna integrated amplifier according to the second embodiment will be described with reference to FIGS. 6 to 8.

The antenna integrated amplifier 1Aa illustrated in FIG. 6 includes the antenna board 10, the radiator 20, and a support unit 30Aa interposed therebetween. As illustrated in FIGS. 6, 7A and 7C, the front surface 10a of the antenna board 10 is provided with the plurality of antennas 11 and a feed layer 14 electrically connected to the antennas (e.g., in unit of multiple ones). As illustrated in FIGS. 6, 7B and 7C, the rear surface 10b of the antenna board 10 is provided with a pad 15 which is electrically connected to the feed layer 14 through the conductor portion 12 provided inside the board and a GND layer 16 separated from the pad 15.

As illustrated in FIGS. 6, 7A, and 7C, the front surface 10a of the antenna board 10 may be provided with a pad 17 to which the semiconductor device 80 is bonded using a bump 81. As illustrated in FIGS. 6, 7B, and 7C, the rear surface 10b of the antenna board 10 may be provided with a pad 18 which is electrically connected to the pad 17 on the front surface 10a through the conductor portion 13 provided inside the board. Furthermore, as illustrated in FIGS. 6, 7A, and 7C, the front surface 10a of the antenna board 10 may be provided with a connection portion 19 to which the connector 90 is connected. For example, as the semiconductor device 80, a device having, for example, the functions of the baseband circuit 210, the up-converter 220, the oscillator 230, and the phase shifter 240 described with regard to the transmitter 200 (FIG. 2) is connected to the antenna board 10. Alternatively, another device having, for example, the functions of the baseband circuit 210, the up-converter 220, the oscillator 230, and the phase shifter 240 described for the transmitter 200 (FIG. 2) is connected to the antenna board 10 by the connector 90.

As illustrated in FIGS. 6 and 7A to 7C, a protective film 10c and a protective film 10d each having an opening at a predetermined position are provided respectively on the front surface 10a and the rear surface 10b of the antenna board 10.

As illustrated in FIG. 6, a plate-shaped member is used as the radiator 20. A metal material having good thermal conductivity is used in the radiator 20. The support unit 30Aa is provided on the surface 20a of the radiator 20 through a binder 100.

As illustrated in FIG. 6, the support unit 30Aa includes the amplification module 40 (one in the example of FIG. 6 in the cross-sectional view) disposed to face a portion of the antenna board 10 and the support module 50 (three in the example of FIG. 6 in the cross-sectional view) disposed to face another portion of the antenna board 10. The amplification module 40 includes the amplifier 42. As illustrated in FIG. 6, the support unit 30Aa further includes the bump 60 provided on the surface 40a of the amplification module 40 and the bump 70 provided on the surface 50a of the support module 50.

For example, as illustrated in FIG. 8, a plurality of amplification modules 40 (four in the example of FIG. 8 in the plan view) are arranged in a line to face a predetermined region 111 on the rear surface 10b of the antenna board 10. A plurality of support modules 50 (twenty four in the example of FIG. 8 in the plan view) are arranged in a grid shape to face a region 112 which is different from the region 111 where the amplification modules 40 are arranged on the rear surface 10b of the antenna board 10. Predetermined intervals are provided between the respective amplification modules 40, between the respective support modules 50, and between the amplification module 40 and the support module 50.

Moreover, the arrangement of the amplification modules 40 and the support modules 50 illustrated in FIG. 8 is an example, and the disclosure is not limited thereto. The support modules 50 are located at positions different from those of the amplification modules 40 according to the number and the planar size of amplification modules 40, the position of one or more amplification modules 40 arranged on the rear surface 10b of the antenna board 10, or the like.

As illustrated in FIG. 6, the amplification module 40 and the support module 50 are disposed on the radiator 20 with the binder 100 interposed therebetween. Various types of bonding materials capable of fixing the amplification module 40 and the support module 50 on the radiator 20, for example, a solder, a brazing material, paste containing a conductive material (conductive paste), or a resin are used in the binder 100. In order to efficiently transfer heat generated in the amplifier 42 of the amplification module 40 to the radiator 20, a bonding material having good thermal conductivity may be used in the binder 100. In order to connect the amplifier 42 of the amplification module 40 to the radiator 20 through a GND, a bonding material having good electrical conductivity may be used in the binder 100.

For example, a solder material is used in the bump 60 provided on the amplification module 40 and the bump 70 provided on the support module 50. The bump 60 provided on the amplification module 40 is bonded to the pad 15 (or the pad 18) exposed from the opening in the protective film 10d provided on the antenna board 10. Therefore, a portion of the antenna board 10 is supported by the amplification module 40 and the bump 60. The amplifier 42 (the terminal 43 thereof) of the amplification module 40 is electrically connected to the antenna 11 of the antenna board 10 through the conductor portion 44, the bump 60, the pad 15, the conductor portion 12, and the feed layer 14. Further, the bump 70 provided on the support module 50 is bonded to a portion of the GND layer 16 provided on the antenna board 10 which is exposed from the opening in the protective film 10d. Therefore, another portion of the antenna board 10 is supported by the support module 50 and the bump 70.

As described above, in the antenna integrated amplifier 1Aa, the antenna board 10 is supported by the amplification module 40 and the bump 60 and is also supported by the support module 50 and the bump 70, so that the antenna board 10 is stably held with respect to the radiator 20.

Figure 9:
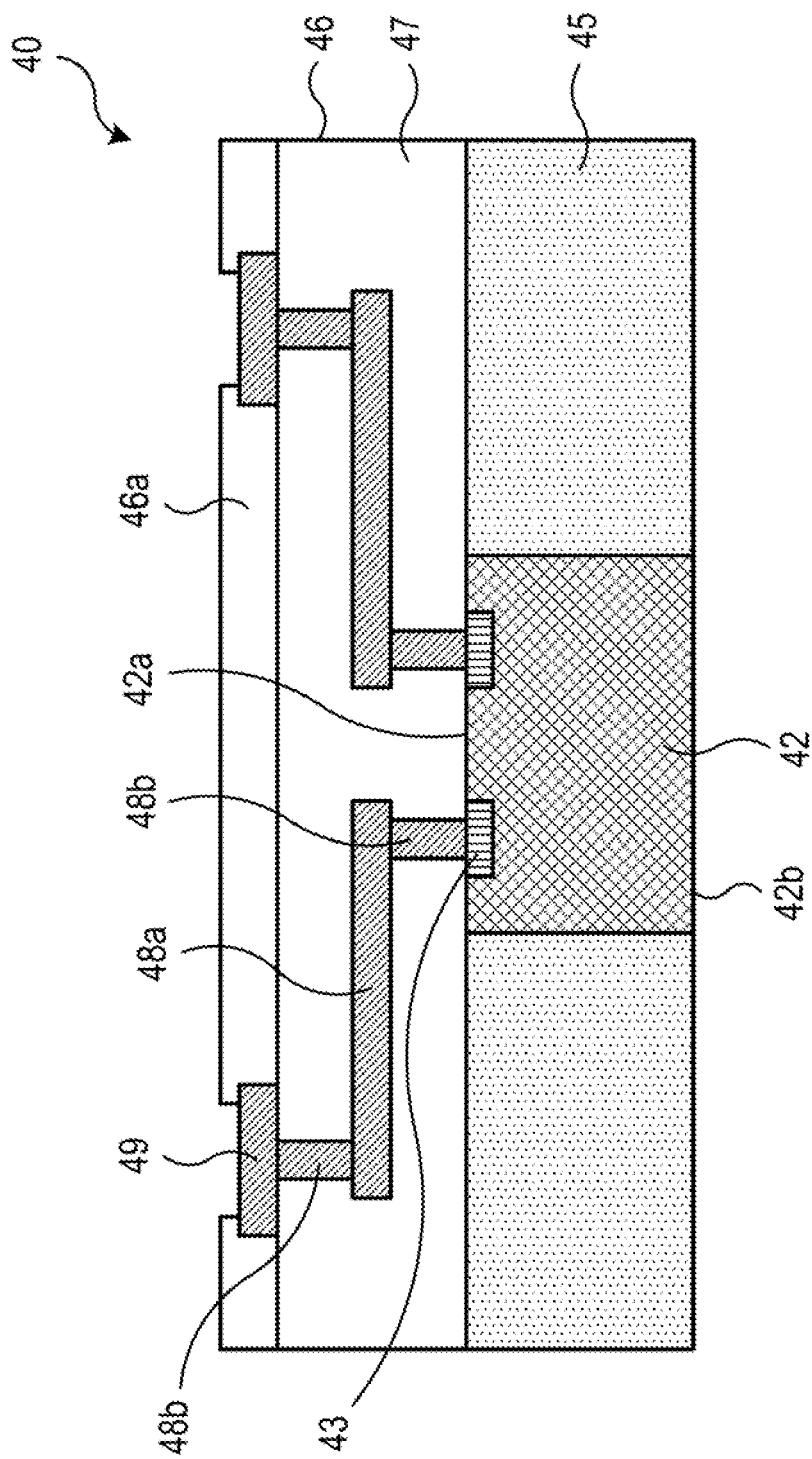
FIG. 9 is a view illustrating an example of an amplification module according to the second embodiment.

The amplification module 40 and the support module 50 will be further described. First, the amplification module 40 will be described with reference to FIG. 9. FIG. 9 is a view illustrating an example of the amplification module according to the second embodiment. FIG. 9 schematically illustrates a cross-sectional view of a major part of an example of the amplification module.

For example, the amplification module 40 as illustrated in FIG. 9 is used in the antenna integrated amplifier 1Aa (FIG. 6). The amplification module 40 illustrated in FIG. 9 includes the amplifier 42, a resin layer 45, and a redistribution layer 46.

For example, a semiconductor device including, for example, a GaN-HEMT in an amplifier circuit is used for the amplifier 42. The terminal 43 is provided on the front surface 42a of the amplifier 42. The amplifier 42 is embedded in the resin layer 45 so that the terminal 43 on the front surface 42a is exposed. For example, the amplifier 42 is embedded in the resin layer 45 so that the rear surface 42b opposite to the front surface 42a on which the terminal 43 is provided is exposed.

Various types of resin materials are used in the resin layer 45. For example, an epoxy resin, a phenol resin, or a polyimide resin may be used as a resin material of the resin layer 45. The resin material of the resin layer 45 may contain an insulating filler such as silicon oxide ($SiO_2$).

The redistribution layer 46 is provided on the resin layer 45 and the amplifier 42 embedded in the resin layer 45. The redistribution layer 46 includes an insulating layer 47, a wire 48a and a via 48b (conductor portion) provided inside the insulating layer 47, and a pad 49 and a protective film 46a provided on a surface of the insulating layer 47. Various types of insulating materials are used in the insulating layer 47. For example, a resin material such as a polyimide resin, an epoxy resin, a phenol resin, or a polybenzoxazole resin may be used as an insulating material of the insulating layer 47. Various types of conductor materials are used in the wire 48a, the via 48b, and the pad 49. For example, a metal material such as Cu or Al may be used as a conductor material of the wire 48a, the via 48b, and the pad 49. For example, an insulating material such as a solder resist is used in the protective film 46a.

The amplification module 40 is formed, for example, using a wafer level package (WLP) technology as described later. The wire 48a, the via 48b, and the pad 49 of the redistribution layer 46 are connected to the terminal 43 of the amplifier 42 included in the amplification module 40. FIG. 9 illustrates, as one example of the amplification module 40, a structure of a fan-out wafer level package (FOWLP) in which the terminal 43 of the amplifier 42 embedded in the resin layer 45 is surrounded by the wire 48a and the via 48b in the redistribution layer 46 and the pad 49 is located outside the amplifier 42 in the transverse direction. However, the number and positions of wires 48a and vias 48b, the number and positions of pads 49, and the number and positions of openings in the protective film 46a are not limited to those illustrated in FIG. 9.

Moreover, the resin layer 45 and the redistribution layer 46 of the amplification module 40 illustrated in FIG. 9 correspond to the package 41 (FIG. 1) described in the first embodiment. The wire 48a, the via 48b, and the pad 49 provided in the redistribution layer 46 of the amplification module 40 illustrated in FIG. 9 correspond to the conductor portion 44 (FIG. 1) described in the first embodiment.

Figure 10:
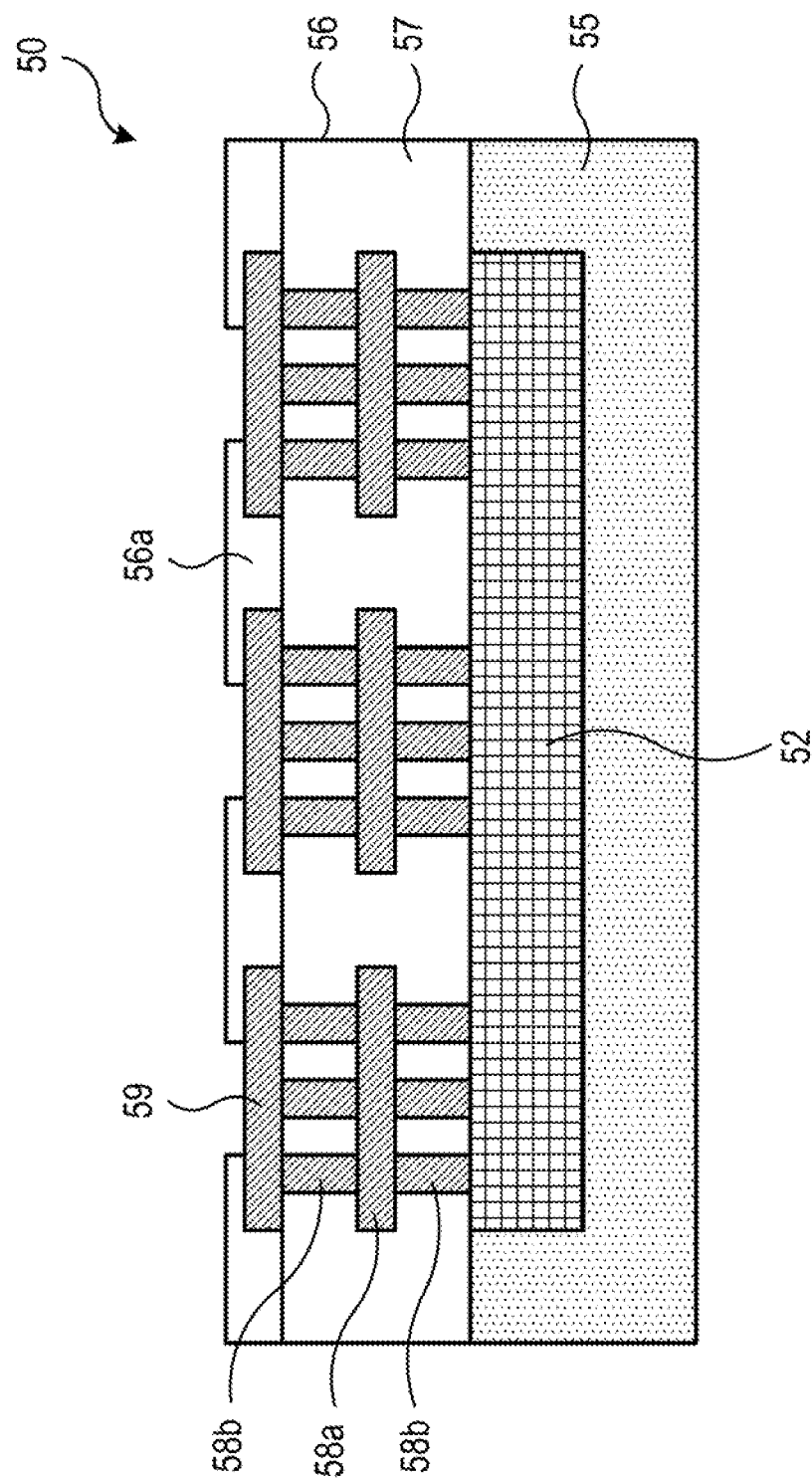
FIG. 10 is a view (part 1) illustrating an example of a support module according to the second embodiment.
Figure 11:
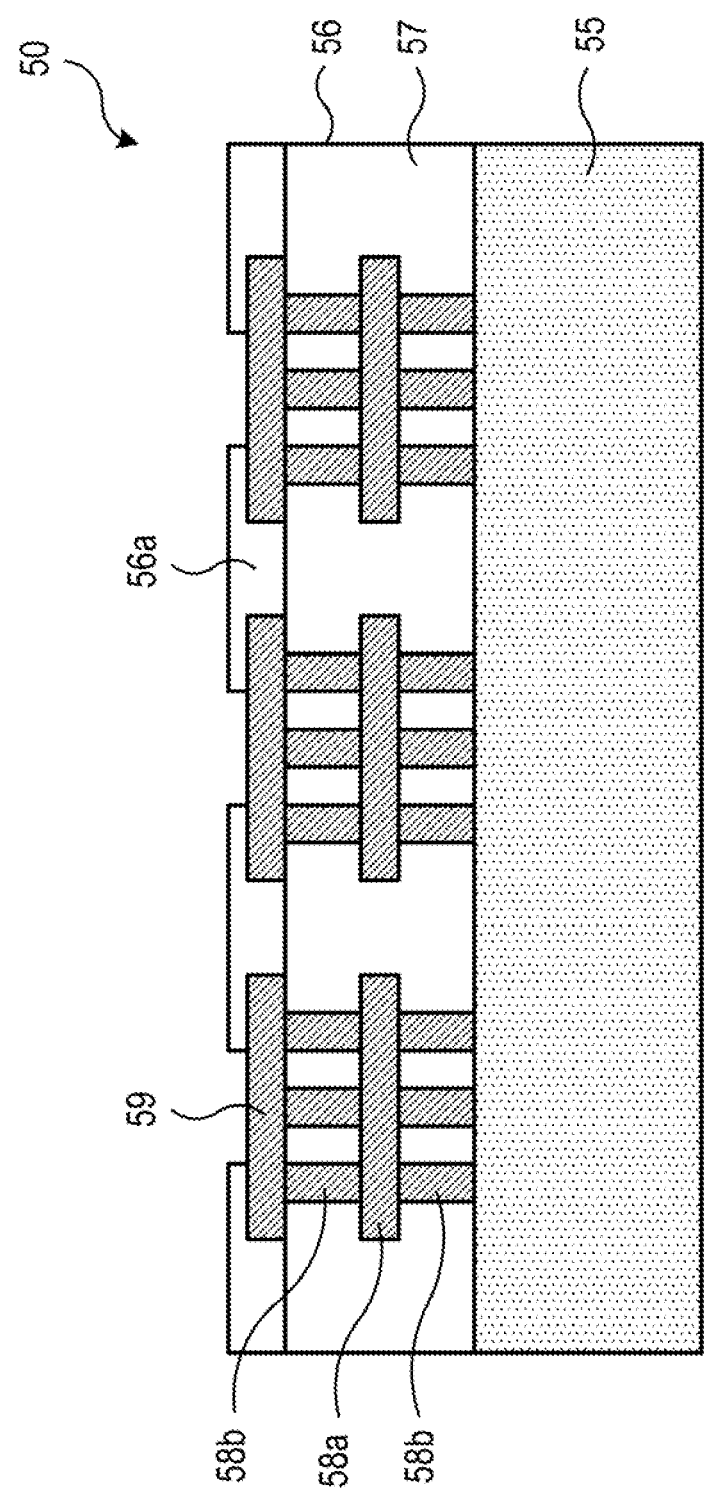
FIG. 11 is a view (part 2) illustrating an example of a support module according to the second embodiment.

Subsequently, the support module 50 will be described with reference to FIGS. 10 and 11. FIGS. 10 and 11 are views illustrating examples of the support module according to the second embodiment. FIGS. 10 and 11 schematically illustrate cross-sectional views of major parts of examples of the support module.

For example, the support module 50 as illustrated in FIG. 10 is used in the antenna integrated amplifier 1Aa (FIG. 6). The support module 50 illustrated in FIG. 10 includes a chip 52, a resin layer 55, and a redistribution layer 56.

For example, a dummy chip is used for the chip 52. A chip using a material having rigidity higher than that of the resin layer 55, for example, various types of chips formed of a metal or ceramic are used for the chip 52.

Various types of resin materials are used in the resin layer 55. For example, an epoxy resin, a phenol resin, or a polyimide resin may be used as a resin material of the resin layer 55. The resin material of the resin layer 55 may contain an insulating filler such as silicon oxide.

The redistribution layer 56 is provided on the resin layer 55 and the chip 52 embedded in the resin layer 55. The redistribution layer 56 includes an insulating layer 57, a wire 58a and a via 58b (conductor portions) provided inside the insulating layer 57, and a pad 59 and a protective film 56a provided on a surface of the insulating layer 57. Various types of insulating materials are used in the insulating layer 57. For example, a resin material such as a polyimide resin, an epoxy resin, a phenol resin, or a polybenzoxazole resin may be used as an insulating material of the insulating layer 57. Various types of conductor materials may be used in the wire 58a, the via 58b, and the pad 59. For example, a metal material such as Cu or Al is used as a conductor material of the wire 58a, the via 58b, and the pad 59. For example, an insulating material such as a solder resist is used in the protective film 56a.

In the support module 50 including the chip 52, as illustrated in FIG. 10, a stack of the wire 58a and the via 58b extending upward from the chip 52 is provided on the chip 52 embedded in the resin layer 55, and the pad 59 as an uppermost layer conductor is provided on the stack. For example, such a stack of the wire 58a and the via 58b and the pad 59 thereon are provided to correspond to at least one location (three locations in the example of FIG. 10 in the cross-sectional view) on the chip 52. However, the number and positions of stacks of the wire 58a and the via 58b, the number and positions of pads 59, and the number and positions of openings in the protective film 56a are not limited to those illustrated in FIG. 10.

Moreover, the resin layer 55 and the redistribution layer 56 of the support module 50 illustrated in FIG. 10 correspond to the package 51 (FIG. 1) described in the first embodiment. Further, for example, as illustrated in FIG. 11, the support module 50 in which the chip 52 as described above is not included in the resin layer 55 may be used in the antenna integrated amplifier 1Aa (FIG. 6).

The support module 50 illustrated in FIG. 11 includes the resin layer 55 and the redistribution layer 56 provided on the resin layer 55. The redistribution layer 56 includes the insulating layer 57, the wire 58a and the via 58b provided inside the insulating layer 57, and the pad 59 and the protective film 56a provided on the surface of the insulating layer 57, as described above. In the support module 50 illustrated in FIG. 11, the chip 52 as described above is not embedded in the resin layer 55.

In the support module 50 not including the chip 52, as illustrated in FIG. 11, a stack of the wire 58a and the via 58b extending upward from the resin layer 55 is provided on the resin layer 55, and the pad 59 as an uppermost layer conductor is provided on the stack. For example, such a stack of the wire 58a and the via 58b and the pad 59 thereon are provided to correspond to at least one location (three locations in the example of FIG. 11 in the cross-sectional view) on the resin layer 55. However, the number and positions of stacks of the wire 58a and the via 58b, the number and positions of pads 59, and the number and positions of openings in the protective film 56a are not limited to those illustrated in FIG. 11.

Moreover, the resin layer 55 and the redistribution layer 56 of the support module 50 illustrated in FIG. 11 correspond to the package 51 (FIG. 1) described in the first embodiment. The support module 50 having the configuration as illustrated in FIG. 10 or 11 or in FIGS. 10 and 11 is formed along with the amplification module 40 having the configuration as illustrated in FIG. 9 using, for example, the WLP technology. An example of a method of forming the amplification module 40 and the support module 50 will be described with reference to FIGS. 12A to 13D.

FIGS. 12A to 13D are views illustrating an example of a method of forming the amplification module and the support module according to the second embodiment. FIGS. 12A to 12D and FIGS. 13A to 13D schematically illustrate cross-sectional views of major parts of a process of forming the amplification module and the support module, respectively.

Here, a case where the support module 50 including the chip 52 and the support module 50 not including the chip 52 are formed along with the amplification module 40 including the amplifier 42 will be described by way of example.

Figure 12A:
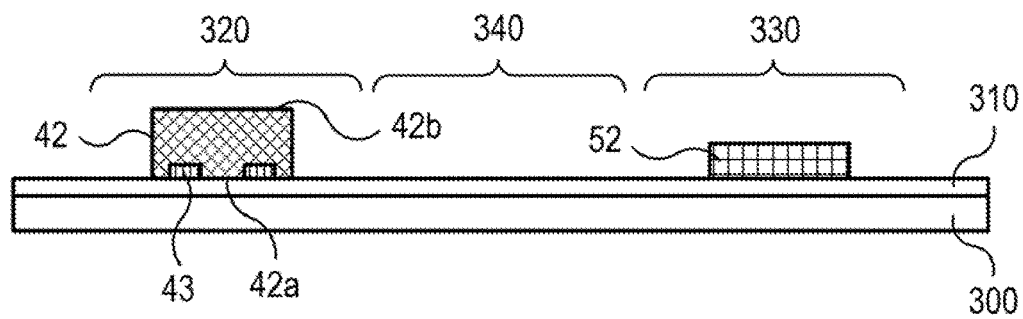
FIGS. 12A to 12D are views (part 1) illustrating an example of a method of forming an amplification module and a support module according to the second embodiment.

First, as illustrated in FIG. 12A, the amplifier 42 is disposed in a region 320 of an adhesive layer 310 provided on a support substrate 300 in which the amplification module 40 including the amplifier 42 is formed. The chip 52 is disposed in a region 330 of the adhesive layer 310 provided on the support substrate 300 in which the support module 50 including the chip 52 is formed. The amplifier 42 and the chip 52 are adhered to and fixed on the adhesive layer 310. The chip 52 is not disposed in a region 340 of the adhesive layer 310 provided on the support substrate 300 in which the support module 50 not including the chip 52 is formed.

Figure 12B:
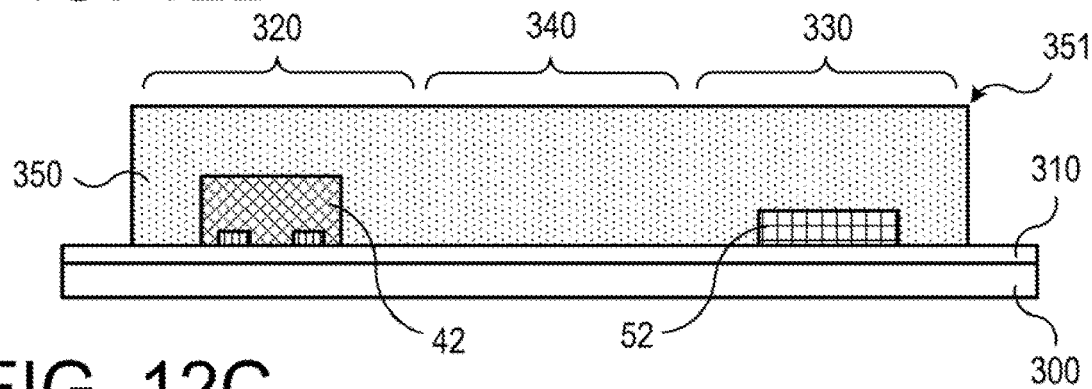

After the arrangement of the amplifier 42 and the chip 52, as illustrated in FIG. 12B, a resin layer 350 is formed on the region 320, the region 330, and the region 340 of the support substrate 300. The resin layer 350 is formed, for example, by molding. The amplifier 42 disposed in the region 320 and the chip 52 disposed in the region 330 are sealed by the resin layer 350. Therefore, a substrate (pseudo wafer) 351 in which the amplifier 42 and the chip 52 are embedded in the resin layer 350 is formed on the adhesive layer 310 provided on the support substrate 300.

Figure 12C:
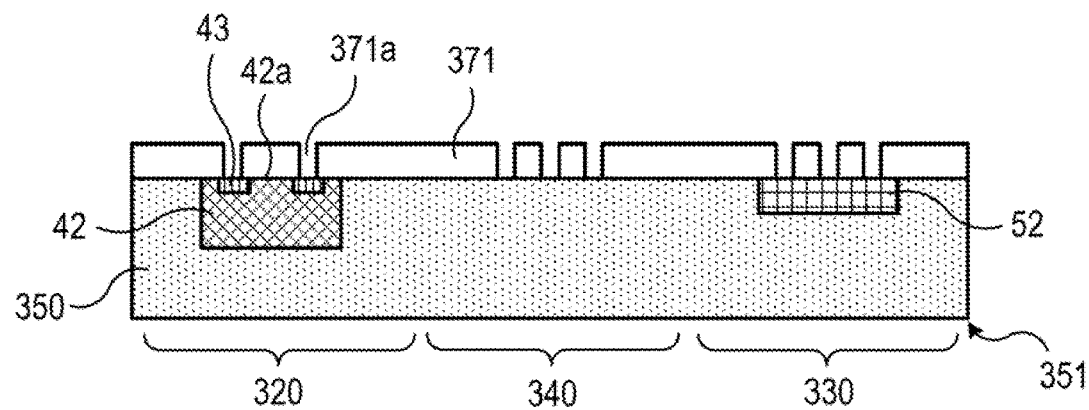

After the formation of the resin layer 350, the pseudo wafer 351 in which the amplifier 42 and the chip 52 are embedded in the resin layer 350 is peeled off from the adhesive layer 310 provided on the support substrate 300. Then, as illustrated in FIG. 12C, a first insulating layer 371 as a first redistribution layer (redistribution layer 360 to be described later) is formed on the surface of the pseudo wafer 351 peeled off from the adhesive layer 310. Furthermore, as illustrated in FIG. 12C, an opening 371a is formed in the insulating layer 371 to communicate with the terminal 43 on the front surface 42a of the amplifier 42 disposed in the region 320, the chip 52 disposed in the region 330, and the resin layer 350 in the region 340. For example, a photosensitive resin material is used in the insulating layer 371. In this case, the photosensitive resin material which is to be the insulating layer 371 is formed on the surface of the pseudo wafer 351 peeled off from the adhesive layer 310 using a coating method, for example, and the exposure and development of the formed resin material are performed so that the insulating layer 371 having the opening 371a is formed.

Figure 12D:
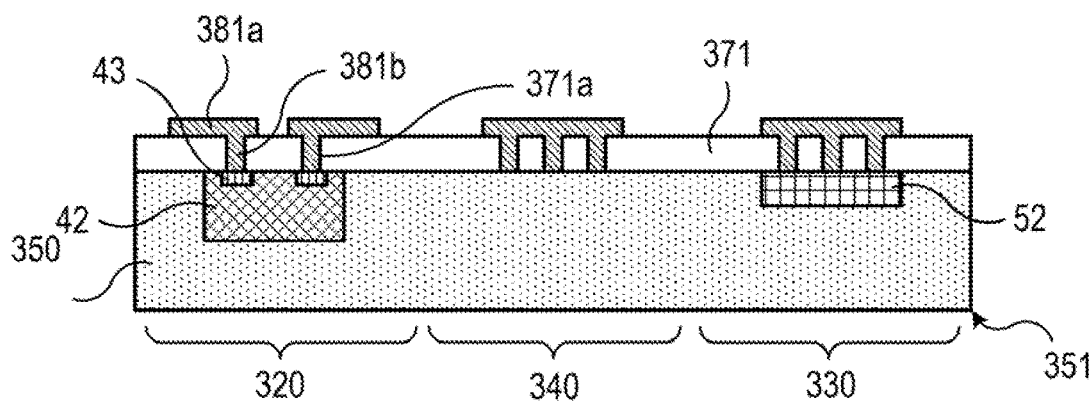

After the formation of the first insulating layer 371 having the opening 371a, as illustrated in FIG. 12D, a via 381b and a wire 381a connected to the via 381b are formed in the opening 371a in the insulating layer 371 and on the upper surface of the insulating layer 371, respectively. For example, a conductor material such as Cu is formed, and the via 381b and the wire 381a are formed on the insulating layer 371 having the opening 371a using a photolithographic technique, a plating technique (electroless plating method or electrolytic plating method), or an etching technique.

Figure 13A:
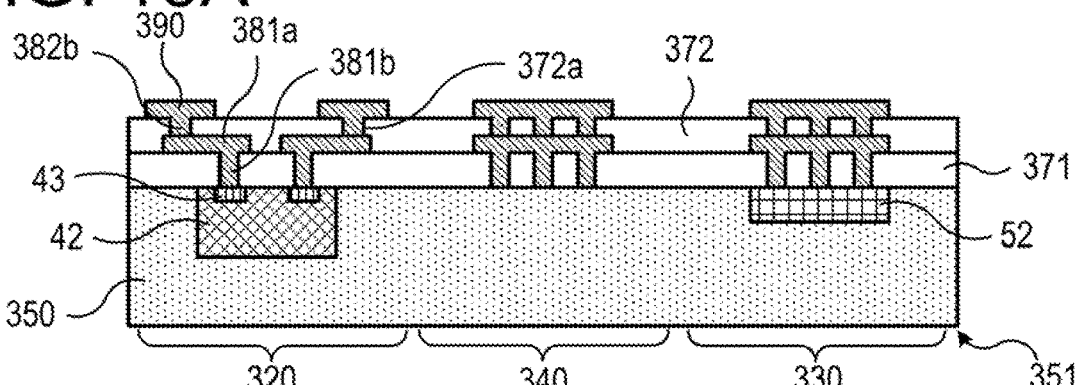
FIGS. 13A to 13D are views (part 2) illustrating the example of the method of forming the amplification module and the support module according to the second embodiment.

After the formation of the via 381b and the wire 381a in a first layer, as illustrated in FIG. 13A, a second insulating layer 372 having an opening 372a is formed in the same manner as in FIG. 12C. Furthermore, a via 382b and a wire connected to the via 382b in a second layer as illustrated in FIG. 13A are formed in the same manner as in FIG. 12D. In this example, the wire functions as a pad 390. Moreover, likewise, in a case of forming insulating layers, vias, and wires in a third layer and subsequent layers, the processes as described with reference to FIGS. 12C and 12D may also be repeated.

Figure 13B:
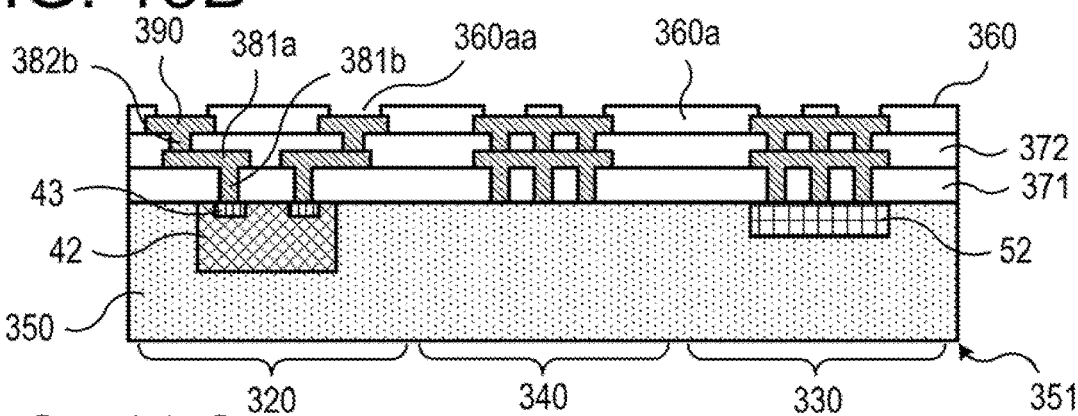

After the formation of the via 382b and the pad 390 in the second layer, for example, a solder resist is used, and as illustrated in FIG. 13B, a protective film 360a having an opening 360aa communicating with the pad 390 is formed. Therefore, the redistribution layer 360 is formed on the pseudo wafer 351.

Figure 13C:
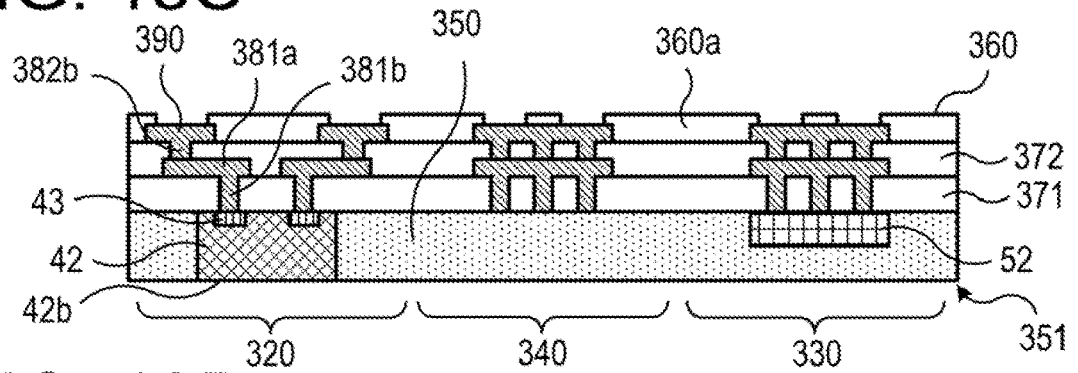

After the formation of the redistribution layer 360, as illustrated in FIG. 13C, the resin layer 350 of the pseudo wafer 351 is back-ground so that the rear surface 42b of the embedded amplifier 42 is exposed. Moreover, the back-grinding that exposes the rear surface 42b of the amplifier 42 may be performed before the formation of the redistribution layer 360 as well as after the formation of the redistribution layer 360.

After the formation of the pseudo wafer 351 as illustrated in FIG. 13C including the back-ground resin layer 350 and the redistribution layer 360 provided thereon, dicing is performed at the boundary positions of the region 320, the region 330 and the region 340. Therefore, as illustrated in FIG. 13D, the amplification module 40 including the amplifier 42, the support module 50 including the chip 52, and the support module 50 not including the chip 52 are formed.

Figure 13D:
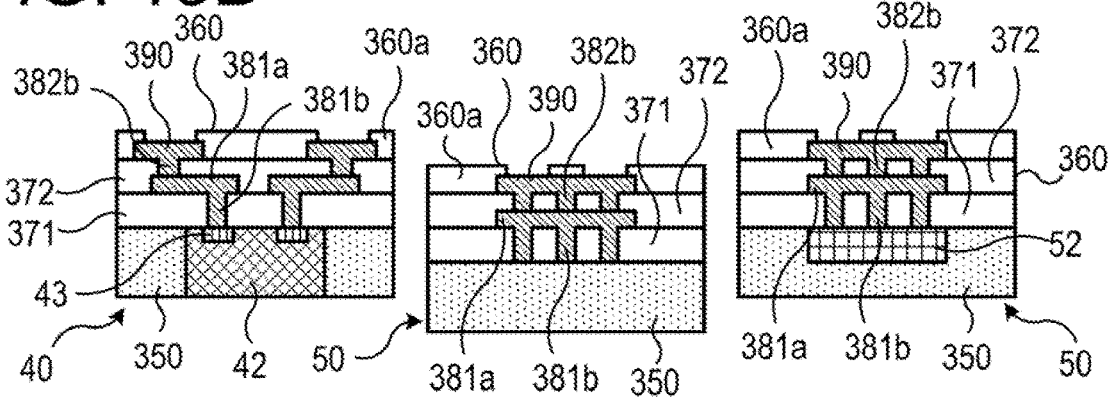

Moreover, the resin layer 350 and the redistribution layer 360 of the amplification module 40 illustrated in FIG. 13D correspond respectively to the resin layer 45 and the redistribution layer 46 of the amplification module 40 having the configuration as illustrated in FIG. 9. Here, the insulating layers 371 and 372 illustrated in FIG. 13D correspond to the insulating layer 47 illustrated in FIG. 9. The vias 381b and 382b illustrated in FIG. 13D correspond to the via 48b illustrated in FIG. 9. The wire 381a illustrated in FIG. 13D corresponds to the wire 48a illustrated in FIG. 9. The pad 390 illustrated in FIG. 13D corresponds to the pad 49 illustrated in FIG. 9. The protective film 360a illustrated in FIG. 13D corresponds to the protective film 46a illustrated in FIG. 9.

Further, the resin layer 350 and the redistribution layer 360 of each of the support module 50 including the chip 52 and the support module 50 not including the chip 52 illustrated in FIG. 13D correspond respectively to the resin layer 55 and the redistribution layer 56 of the support module 50 having the configuration as illustrated in FIGS. 10 and 11. Here, the insulating layers 371 and 372 illustrated in FIG. 13D correspond to the insulating layer 57 illustrated in FIGS. 10 and 11. The vias 381b and 382b illustrated in FIG. 13D correspond to the via 58b illustrated in FIGS. 10 and 11. The wire 381a illustrated in FIG. 13D corresponds to the wire 58a illustrated in FIGS. 10 and 11. The pad 390 illustrated in FIG. 13D corresponds to the pad 59 illustrated in FIGS. 10 and 11. The protective film 360a illustrated in FIG. 13D corresponds to the protective film 56a illustrated in FIGS. 10 and 11.

The support module 50 including the chip 52 and the support module 50 not including the chip 52 are formed along with the amplification module 40 including the amplifier 42 by the method illustrated in FIGS. 12A to 12D and FIGS. 13A to 13D.

Here, the example in which the support module 50 including the chip 52 and the support module 50 not including the chip 52 are formed along with the amplification module 40 including the amplifier 42 has been illustrated. Besides, among the support module 50 including the chip 52 and the support module 50 not including the chip 52, only the support module 50 including the chip 52 may be formed along with the amplification module 40, or only the support module 50 not including the chip 52 may be formed along with the amplification module 40.

According to the method as described above, the amplification module 40 and the support module 50 are simultaneously formed by the WLP process. Therefore, the thickness of the amplification module 40 and the thickness of the support module 50 may be the same as or equivalent to each other. In the antenna integrated amplifier 1Aa illustrated in FIG. 6, the amplification module 40 and the support module 50 are used, and the antenna board 10 is supported with respect to the radiator 20 by the support modules and the bumps 60 and 70 provided thereon. By using the amplification module 40 and the support module 50 formed by the method as described above, the inclination of the antenna board 10 with respect to the radiator 20 and the uneven load applied to the bumps 60 and 70 due to the inclination may be suppressed, and thus, the antenna board 10 may be stably held.

Figure 14A:
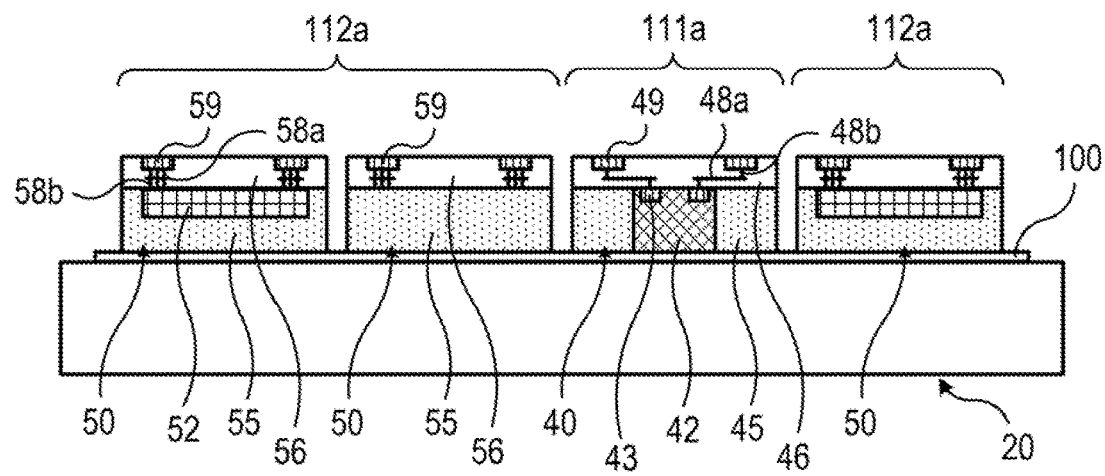
FIGS. 14A to 14C are views illustrating an example of a method of assembling the antenna integrated amplifier according to the second embodiment.
Figure 14B:
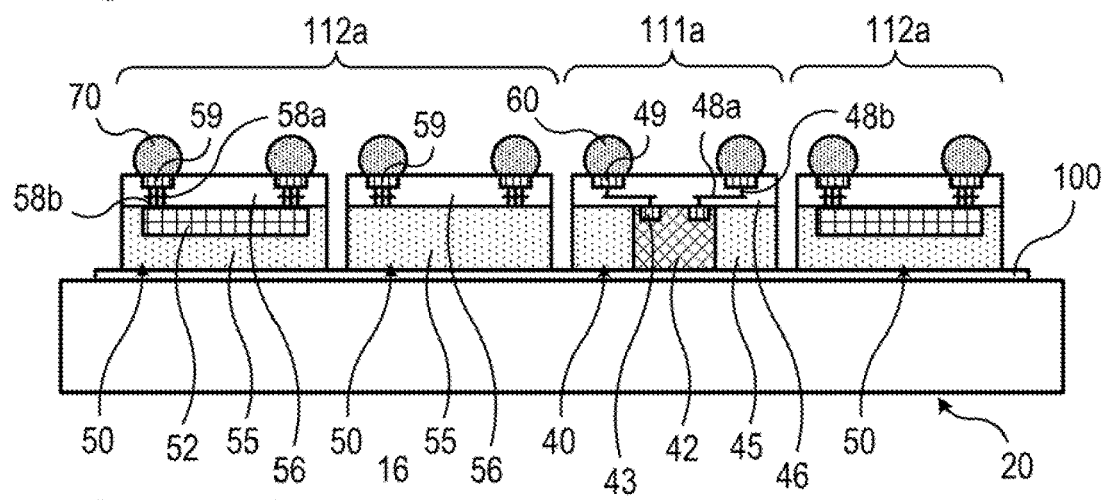
Figure 14C:
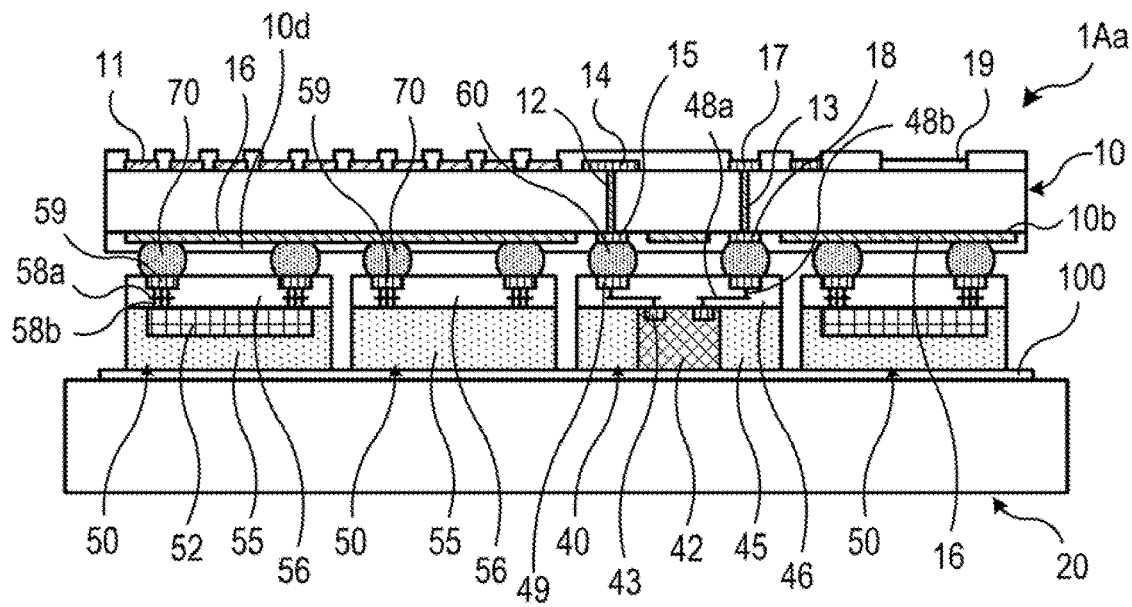

An example of a method of assembling the antenna integrated amplifier 1Aa using the amplification module 40 and the support module 50 will be described with reference to FIGS. 14A to 14C. FIGS. 14A to 14C are views illustrating an example of a method of assembling the antenna integrated amplifier according to the second embodiment. FIGS. 14A to 14C schematically illustrate cross-sectional views of major parts of a process of assembling the antenna integrated amplifier.

Here, an assembling example using the amplification module 40 including the amplifier 42 (FIG. 9 (FIG. 13D)), the support module 50 including the chip 52 (FIG. 10 (FIG. 13D)), and the support module 50 not including the chip 52 (FIG. 11 (FIG. 13D)) is illustrated.

First, as illustrated in FIG. 14A, the binder 100 before being cured is provided on the radiator 20. The amplification module 40 is provided on the binder 100 in a predetermined region 111a. Furthermore, the support module 50 is provided on the binder 100 in a region 112a different from the region 111a where the amplification module 40 is disposed. The binder 100 provided with the amplification module 40 and the support module 50 is cured by a method depending on a material used in the binder, for example, a method such as heating. Therefore, as illustrated in FIG. 14A, the amplification module 40 and the support module 50 are bonded to and fixed on the radiator 20 by the binder 100.

Next, as illustrated in FIG. 14B, the bumps 60 are provided on the pads 49 of the amplification module 40 bonded to the binder 100 on the radiator 20, and the bumps 70 are provided on the pads 59 of the support module 50 bonded to the radiator 20 with the binder 100. For example, solder balls or solder paste is formed as the bumps 60 and the bumps 70 on the pads 49 and the pads 59. Alternatively, the formed solder balls or solder paste is further melted by heating and is solidified by cooling so that the bumps 60 and the bumps 70 are formed. FIG. 14B illustrates, as an example, ball-shaped or substantially ball-shaped bumps 60 and 70 obtained through such heating and cooling.

When heating is performed at the time of formation of the bumps 60 and the bumps 70, the type of a solder material used in the bumps 60 and the bumps 70 is adjusted to suppress the positions of the amplification module 40 and the support module 50 from being changed due to the melting of the binder 100 by heating. Alternatively, the type of a bonding material used in the binder 100 is adjusted. For example, a solder material having a melting point higher than that of the bumps 60 and the bumps 70 may be used in the binder 100, or silver (Ag) paste may be used in the binder 100.

Next, as illustrated in FIG. 14C, the antenna board 10 is bonded to the bumps 60 of the amplification module 40 and the bumps 70 of the support module 50. The antenna board 10 is disposed such that the rear surface 10b on the GND layer 16 side faces the radiator 20 and the amplification module 40 and the support module 50 provided thereon. The protective film 10d which has an opening communicating with the pad 15 and the pad 18 at positions corresponding to the bumps 60 of the amplification module 40 and an opening communicating with the GND layer 16 at a position corresponding to the bumps 70 of the support module 50 is provided in advance on the rear surface 10b of the antenna board 10. The bumps 60 are in contact with the pad 15 and the pad 18 exposed from the protective film 10d of the antenna board 10 disposed to face the radiator board 20, the amplification module 40, and the support module 50, and the bumps 70 are in contact with a portion of the GND layer 16 exposed from the protective film 10d.

In a state where the bumps 60 of the amplification module 40 are in contact with the pad 15 and the pad 18 of the antenna board 10 and the bumps 70 of the support module 50 are in contact with the GND layer 16 of the antenna board 10, the bumps 60 and the bumps 70 are melted by heating and are solidified by cooling. Therefore, as illustrated in FIG. 14C, the bumps 60 provided on the amplification module 40 are bonded to the pad 15 and the pad 18 of the antenna board 10, and the bumps 70 provided on the support module 50 are bonded to the GND layer 16 of the antenna board 10.

In the bonding between the bumps 60 and 70 and the antenna board 10, the type of a solder material used in the bumps 60 and 70 is adjusted to suppress the positions of the amplification module 40 and the support module 50 from being changed due to the melting of the binder 100 by heating during bonding. Alternatively, the type of a bonding material used in the binder 100 is adjusted. For example, a solder material having a melting point higher than that of the bumps 60 and the bumps 70 may be used in the binder 100, or Ag paste may be used in the binder 100.

The antenna integrated amplifier 1Aa is assembled by the method as illustrated in FIGS. 14A to 14C. In the antenna integrated amplifier 1Aa, the antenna board 10 is supported by the amplification module 40, the bumps 60, the support module 50, and the bumps 70 interposed between the radiator 20 and the antenna board 10. In the antenna integrated amplifier 1Aa, the amplification module 40 and the support module 50 which support the antenna board 10 are simultaneously formed by, for example, the WLP process (FIGS. 12A to 13D), and the thicknesses thereof are the same as or equivalent to each other. In the antenna integrated amplifier 1Aa, a portion of the antenna board 10 is supported by the amplification module 40 including the amplifier 42 connected to the antenna 11, and another portion of the antenna board 10 is supported by the support module 50 having the same thickness as or a thickness equivalent to that of the amplification module 40. Therefore, the inclination of the antenna board 10 with respect to the radiator 20 and the uneven load applied to the bumps 60 and 70 due to the inclination are suppressed, and the antenna board 10 is stably held.

FIGS. 14A to 14C illustrate the example of using the support module 50 including the chip 52 and the support module 50 not including the chip 52. As the support module 50 including the chip 52, for example, one illustrated in FIG. 10 (or FIG. 13D) is used, and as the support module 50 not including the chip 52, for example, one illustrated in FIG. 11 (or FIG. 13D) is used.

Here, in the support module 50 illustrated in FIG. 10, the pad 59 to which the bump 70 supporting the antenna board 10 is bonded is supported on the chip 52 by the stack of the wire 58a and the via 58b. Therefore, when the chip 52 having relatively high rigidity is used, the support module 50 including the chip 52 as illustrated in FIG. 10 more stably supports the antenna board 10 than the support module 50 not including the chip 52. For example, when the support module 50 including the chip 52 which may more stably support the antenna board 10 as described above is provided to correspond to the vicinity of the edge of the antenna board 10 to which a relatively large force is very likely applied, the inclination of the antenna board 10 is effectively suppressed. In this case, when the support module 50 not including the chip 52 is provided inside the vicinity of the edge of the antenna board 10, the cost of the antenna integrated amplifier 1Aa may be reduced since the number of chips 52 used in the antenna integrated amplifier 1Aa is reduced.

Figure 15A:
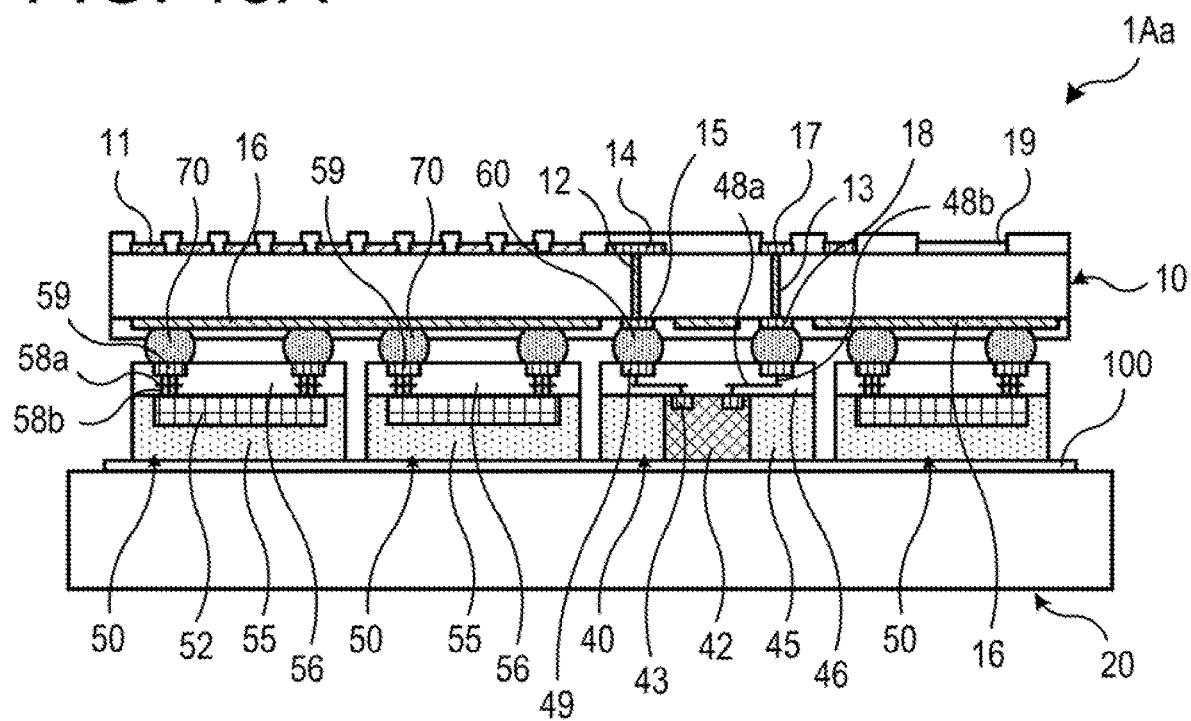
Figure 15B:
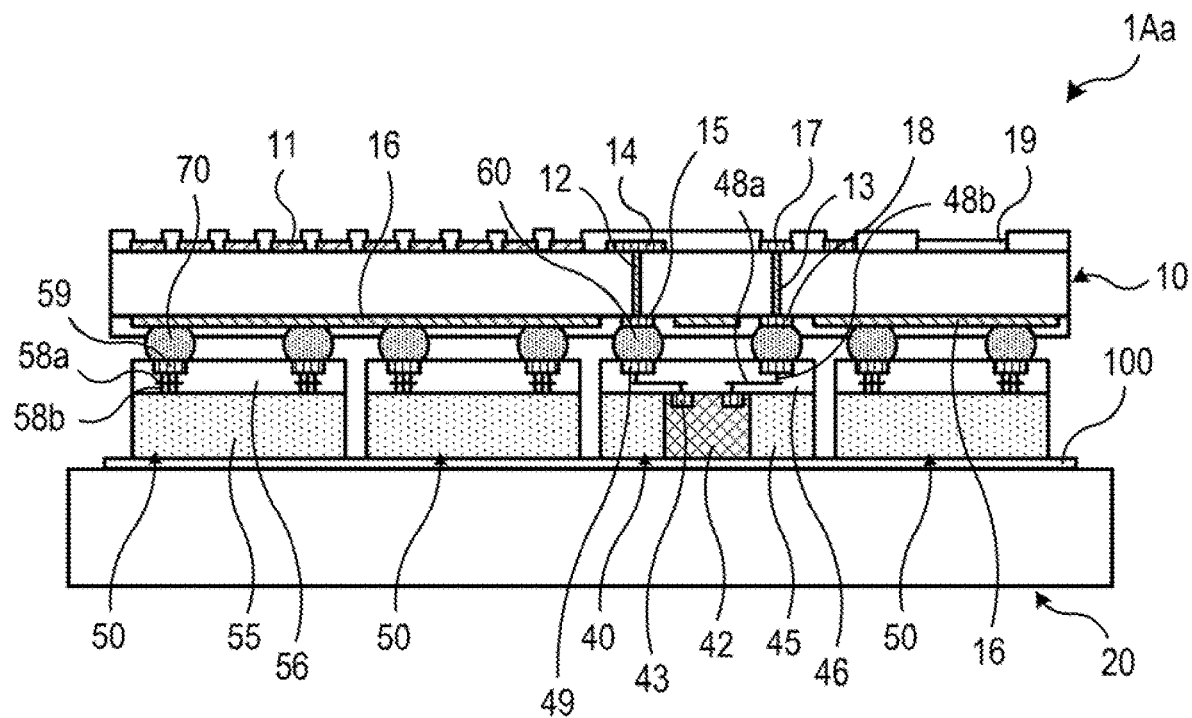

FIGS. 15A and 15B are views illustrating modifications of the antenna integrated amplifier according to the second embodiment. FIGS. 15A and 15B schematically illustrate cross-sectional views of major parts of examples of the antenna integrated amplifier, respectively.

In the antenna integrated amplifier 1Aa, as the support module 50 used along with the amplification module 40, for example, as illustrated in FIG. 15A, among the support module 50 including the chip 52 (FIG. 10) and the support module 50 not including the chip 52 (FIG. 11), only the support module 50 including the chip 52 may be used. According to such an antenna integrated amplifier 1Aa, the inclination of the antenna board 10 with respect to the radiator 20 is further effectively suppressed by the stabilization of the antenna board 10 by the chip 52.

In the antenna integrated amplifier 1Aa, for example, as illustrated in FIG. 15B, among the support module 50 including the chip 52 (FIG. 10) and the support module 50 not including the chip 52 (FIG. 11), only the support module 50 not including the chip 52 may be used as the support module 50 used along with the amplification module 40. According to such an antenna integrated amplifier 1Aa, the cost of the support module 50 and the antenna integrated amplifier 1Aa using the same may be reduced since no chip 52 is used.

Figure 17:
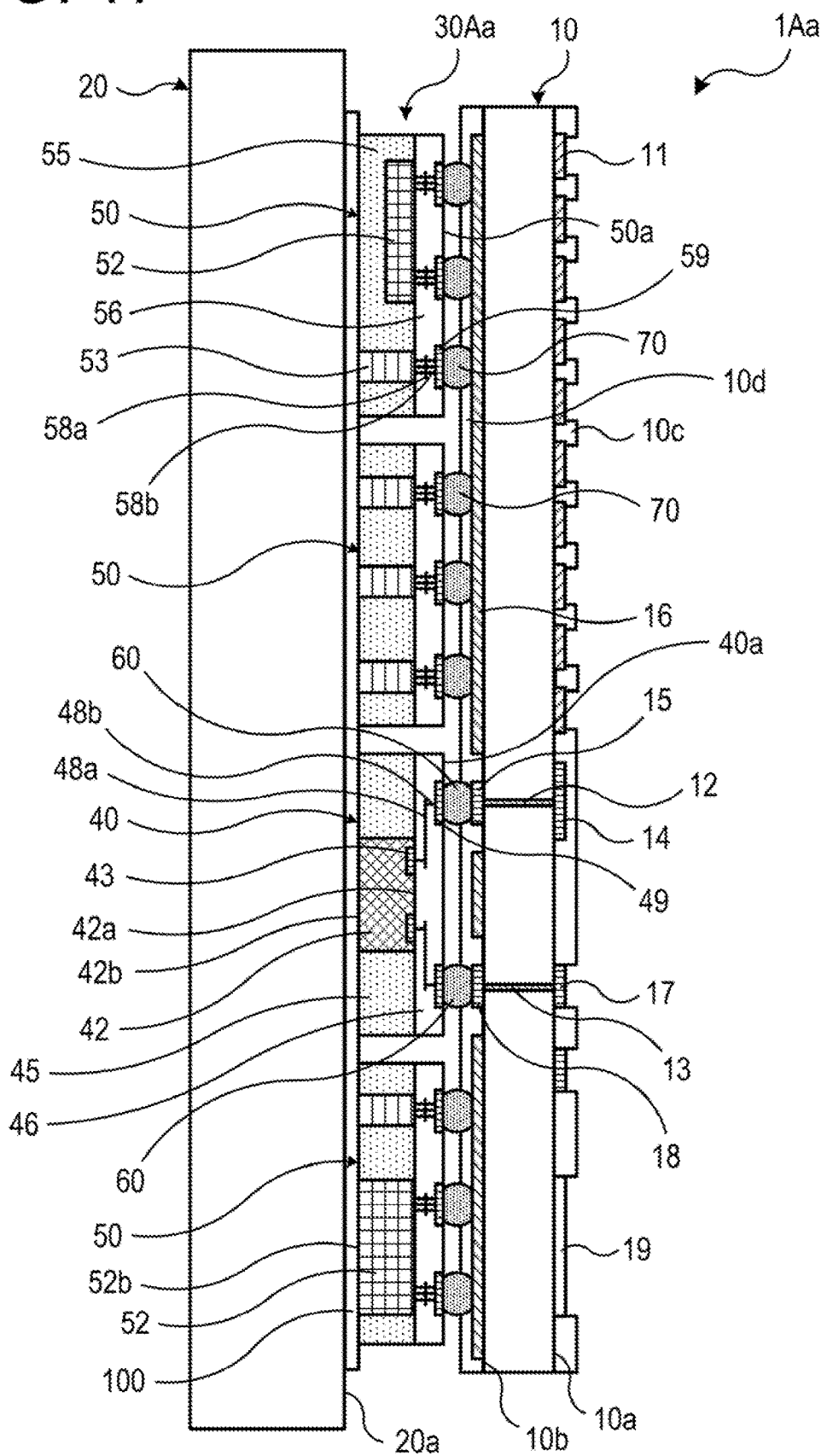
FIG. 17 is a view (part 2) illustrating a further modification of the antenna integrated amplifier according to the second embodiment.

FIGS. 16 and 17 are views illustrating still another modification of the antenna integrated amplifier according to the second embodiment. FIGS. 16 and 17 schematically illustrate cross-sectional views of major parts of an example of the antenna integrated amplifier, respectively.

First, the antenna integrated amplifier 1Aa illustrated in FIG. 16 will be described. The antenna integrated amplifier 1Aa illustrated in FIG. 16 has a configuration in which a rear surface 52b of the chip 52 included in the support module 50 is exposed from the resin layer 55.

Such a support module 50 in which the rear surface 52b of the chip 52 is exposed from the resin layer 55 is formed, for example, using the WLP process as illustrated in FIGS. 12A to 13D. In this case, as the chip 52 of the support module 50, a chip 52 having the same thickness as or a thickness equivalent to that of the amplifier 42 used in the amplification module 40 is used. Then, in the back-grinding (FIG. 13C) of the resin layer 55 (resin layer 350) of the pseudo wafer (pseudo wafer 351) performed after or before the formation of the redistribution layer 56 (redistribution layer 360), the rear surface 52b of the chip 52 is exposed along with the rear surface 42b of the amplifier 42. Thereafter, dicing is performed at a predetermined position of the pseudo wafer, so that the support module 50 in which the rear surface 52b of the chip 52 is exposed from the resin layer 55 may be obtained along with the amplification module 40 in which the rear surface 42b of the amplifier 42 is exposed from the resin layer 45.

In the antenna integrated amplifier 1Aa in which the support module 50 as illustrated in FIG. 16 is used, since the support module 50 is provided along with the amplification module 40 as described above, the antenna board 10 is stably held.

Further, in the antenna integrated amplifier 1Aa illustrated in FIG. 16, when the chip 52 and the binder 100 have electrical conductivity, the chip 52 is electrically connected to the radiator 20 through the binder 100. The chip 52 is also electrically connected to the GND layer 16 of the antenna board 10 through the wire 58a, the via 58b, the pad 59, and the bump 70. That is, in the antenna integrated amplifier 1Aa illustrated in FIG. 16, the GND layer 16 of the antenna board 10 is GND-connected to the radiator 20 through the bump 70, the pad 59, the wire 58a, the via 58b, the electrically conductive chip 52, and the binder 100. Therefore, for example, the signal transmission characteristics from the amplifier 42 of the amplification module 40 to the antenna 11 and the signal radiation characteristic from the antenna 11 may be improved.

Furthermore, in the antenna integrated amplifier 1Aa illustrated in FIG. 16, the GND layer 16 of the antenna board 10 is thermally connected to the radiator 20 through the bump 70, the pad 59, the wire 58a, the via 58b, the thermally conductive chip 52, and the binder 100. Here, heat generated by an operation of the amplifier 42 of the amplification module 40 may be transferred to the radiator 20 through the binder 100, and may also be transferred to the antenna board 10 through the wire 48a, the via 48b, the pad 49, the bump 60, the pad 15, and the pad 18. In the antenna integrated amplifier 1Aa illustrated in FIG. 16, the heat transferred to the antenna board 10 as described above is transferred from the GND layer 16 to the radiator 20 through the bump 70, the pad 59, the wire 58a, the via 58b, the thermally conductive chip 52, and the binder 100. Therefore, overheating of the amplifier 42 and the antenna board 10 and damage or performance deterioration due to the overheating are suppressed.

The configuration of exposing the rear surface 52b of the chip 52 from the resin layer 55 as described in FIG. 16 is not necessarily applied to all of the chips 52 of the support modules 50 included in the antenna integrated amplifier 1Aa.

Subsequently, the antenna integrated amplifier 1Aa illustrated in FIG. 17 will be described. The antenna integrated amplifier 1Aa illustrated in FIG. 17 has a configuration in which the support module 50 is provided with a through-conductor 53 (conductor portion) penetrating the resin layer 55 and the wire 58a, the via 58b, and the pad 59 which are connected to the through-conductor 53. The through-conductor 53 and the wire 58a, the via 58b, and the pad 59 which are connected to the through-conductor 53 may be applied to any of the support module 50 including the chip 52 and the support module 50 not including the chip 52. Further, the through-conductor 53 and the wire, the via 58b, and the pad 59 which are connected to the through-conductor 53 may also be applied to the support module 50 which includes the chip 52 and has the rear surface 52b exposed from the resin layer 55, as described in FIG. 16.

The support module 50 including the through-conductor 53 and the wire 58a, the via 58b, and the pad 59 which are connected to the through-conductor 53 is formed, for example, using the WLP process as illustrated in FIGS. 12A to 13D. In this case, as in the chip 52, a pin-shaped, rod-shaped, or columnar electrode member having electrical conductivity and thermal conductivity is embedded as the through-conductor 53 in the resin layer 55 (resin layer 350). Then, in the back-grinding (FIG. 13C) of the resin layer 55 (resin layer 350) of the pseudo wafer (pseudo wafer 351) performed after or before the formation of the redistribution layer 56 (redistribution layer 360), the through-conductor 53 is exposed along with the rear surface 42b of the amplifier 42. Thereafter, dicing is performed at a predetermined position of the pseudo wafer, so that the support module 50 having the through-conductor 53 exposed from the resin layer 55 may be obtained along with the amplification module 40 having the rear surface 42b of the amplifier 42 exposed from the resin layer 45.

In the antenna integrated amplifier 1Aa using the support module 50 illustrated in FIG. 17, the antenna module 10 is stably held through the provision of the support module 50 along with the amplification module 40 as described above.

Further, in the antenna integrated amplifier 1Aa illustrated in FIG. 17, the GND layer 16 of the antenna board 10 is GND-connected to the radiator 20 through the bump 70, the pad 59, the wire 58a, the via 58b, the electrically conductive through-conductor 53, and the binder 100. Therefore, for example, the signal transmission characteristics from the amplifier 42 of the amplification module 40 to the antenna 11 and the signal radiation characteristic from the antenna 11 may be improved.

Furthermore, in the antenna integrated amplifier 1Aa Illustrated in FIG. 17, heat which is generated in the amplifier 42 of the amplification module 40 and is transferred to the antenna board 10 is transferred from the GND layer 16 to the radiator 20 through the bump 70, the pad 59, the wire 58a, the via 58b, the thermally conductive through-conductor 53, and the binder 100. Therefore, overheating of the amplifier 42 and the antenna board 10 and damage or performance deterioration due to the overheating are suppressed.

The configuration of providing the through-conductor 53 and the wire 58a, the via 58b, and the pad 59 which are connected to the through-conductor 53 as described in FIG. 17 is not necessarily applied to all of the support modules 50 included in the antenna integrated amplifier 1Aa.

As described above, according to the antenna integrated amplifier 1Aa described in the second embodiment, the antenna board 10 is supported by the amplification module 40 and the bump 60 and is also supported by the support module 50 and the bump 70. Therefore, the antenna board 10 is stably held with respect to the radiator 20, and the antenna integrated amplifier 1Aa with high connection reliability between the antenna board 10 and the amplifier 42 is realized.

Third Embodiment

Figure 18:
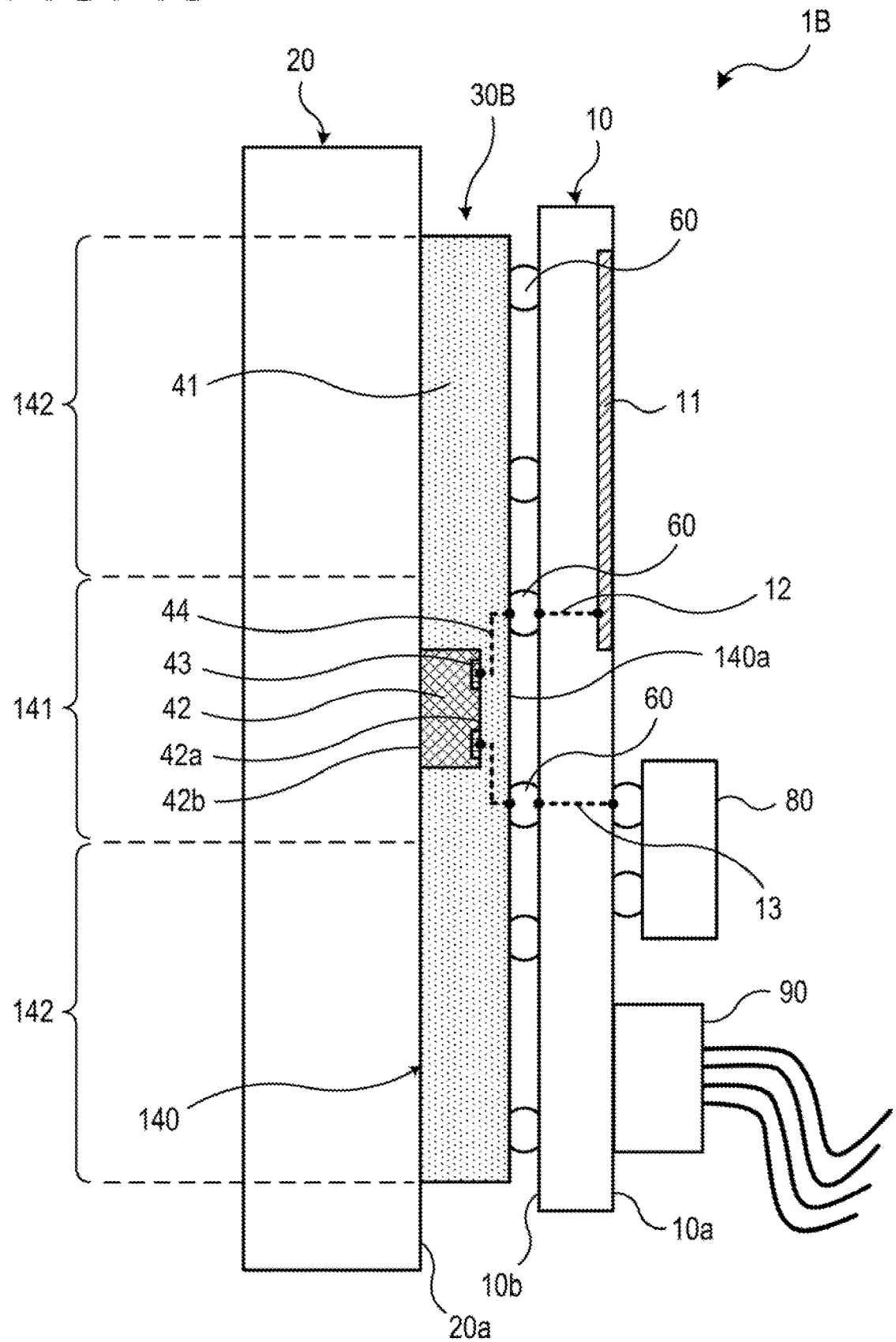
FIG. 18 is a view illustrating an example of an antenna integrated amplifier according to a third embodiment.

FIG. 18 is a view illustrating an example of an antenna integrated amplifier according to a third embodiment. FIG. 18 schematically illustrates a cross-sectional view of a major part of an example of an antenna integrated amplifier.

The antenna integrated amplifier 1B illustrated in FIG. 18 includes the antenna board 10 having the antenna 11, the radiator 20 disposed to face the antenna board 10, and a support unit 30B interposed between the antenna board 10 and the radiator 20. The support unit 30B of the antenna integrated amplifier 18 includes an amplification module 140 which includes a portion 141 facing a portion of the antenna board 10, the portion 141 being provided with at least one (one in the example of FIG. 18 in the cross-sectional view) amplifier 42, and a portion 142 facing another portion of the antenna board 10. These portions 141 and 142 of the amplification module 140 are continuous rather than being separated. The support unit 30B further includes a bump 60 provided on a surface 140a of the amplification module 140. The antenna integrated amplifier 1B is different from the antenna integrated amplifier 1A described in the first embodiment in that the antenna integrated amplifier 18 includes such a support unit 308.

The portion 141 of the amplification module 140 which faces a portion of the antenna board 10 has a function of amplifying a signal by the amplifier 42 and a function of supporting the antenna board 10 along with the bump 60 provided on the surface 140a as described later. The portion 142 of the amplification module 140 which faces another portion of the antenna board 10 has a function of supporting the antenna board 10 along with the bump 60 provided on the surface 140a as described later.

The amplifier 42 of the amplification module 140 is provided in a package 41 in which, for example, a resin material is used. The terminal 43 provided on the front surface 42a of the amplifier 42 is connected to the conductor portion 44 (illustrated by a dotted line in FIG. 18) provided in the package 41. The conductor portion 44 is connected to the bump 60 provided on the surface 140a of the amplification module 140, and the terminal 43 and the bump 60 are electrically connected to each other through the conductor portion 44. The bump 60 is connected to the conductor portion 12 (illustrated by a dotted line in FIG. 18) connected to the antenna 11 of the antenna board 10. The amplifier 42 is electrically connected to the antenna 11 through the terminal 43, the conductor portion 44, the bump 60, and the conductor portion 12 of the antenna board 10. The amplifier 42 is provided, for example, such that the rear surface 42b on the side (radiator 20 side) opposite to the front surface 42a on which the terminal 43 is provided is exposed from the package 41. The amplifier 42 having the rear surface 42b exposed from the package 41 is thermally connected to the radiator 20. Further, when the radiator 20 is used as a GND, the amplifier 42 having the rear surface 42b exposed from the package 41 is electrically connected to the radiator 20.

In the antenna integrated amplifier 1B, the semiconductor device 80 or the connector 90 may be connected to the antenna board 10. For example, the amplifier 42 of the amplification module 140 is electrically connected to the semiconductor device 80 or the connector 90 (the semiconductor device 80 in the example of FIG. 18) through the terminal 43, the conductor portion 44, the bump 60, and the conductor portion 13 of the antenna board 10 (illustrated by a dotted line in FIG. 18). For example, as the semiconductor device 80, a device having, for example, functions of the baseband circuit 210, the up-converter 220, the oscillator 230, and the phase shifter 240 of the transmitter 200 (FIG. 2) is connected to the antenna board 10. Alternatively, another device having, for example, the functions of the baseband circuit 210, the up-converter 220, the oscillator 230, and the phase shifter 240 of the transmitter 200 (FIG. 2) is connected to the antenna board 10 using the connector 90.

In the antenna integrated amplifier 1B, the antenna board 10 is supported by the amplification module 140 which includes the portion 141 facing a portion of the antenna board 10 and the portion 142 facing another portion of the antenna board 10 and the bump 60 provided on the surface 140a thereof. In the amplification module 140, since the portion 142 is provided to continuously extend from the portion 141 in which the amplifier 42 is included, the planar size is increased compared to a case where only the portion 141 including the amplifier 42 is provided. The antenna board 10 is supported by the amplification module 140 and the bump 60 provided thereon. Therefore, the inclination of the antenna board 10 with respect to the radiator 20, the uneven load applied to the bump 60 due to the inclination, and a crack or disconnection of the bump 60 due to the uneven load are suppressed, and thus, the antenna board 10 is stably held with respect to the radiator 20. The antenna integrated amplifier 1B having high connection reliability between the antenna board 10 and the amplifier 42 is realized.

For example, in one example of the antenna integrated amplifier 1B, the area of the amplification module 140 may be approximately 10 times the area of the amplifier 42, and the supporting strength of the antenna board 10 may be approximately 10 times compared to a case where only the amplifier 42 is provided (FIG. 5).

Fourth Embodiment

Here, an example to which the configuration of the antenna integrated amplifier 1A as described above is applied will be described as a fourth embodiment.

Figure 19:
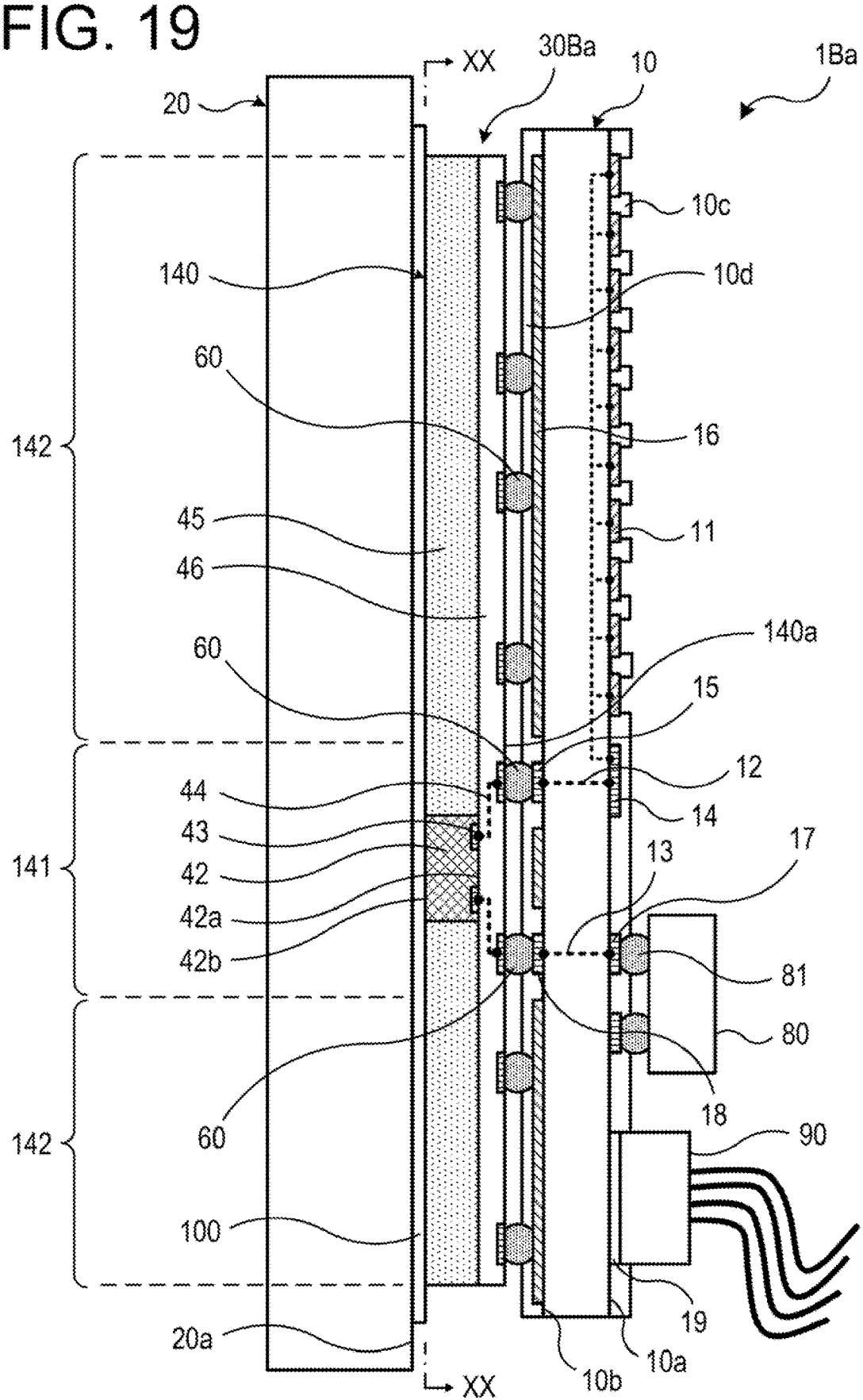
FIG. 19 is a view illustrating an example of an antenna integrated amplifier according to a fourth embodiment.
Figure 20:
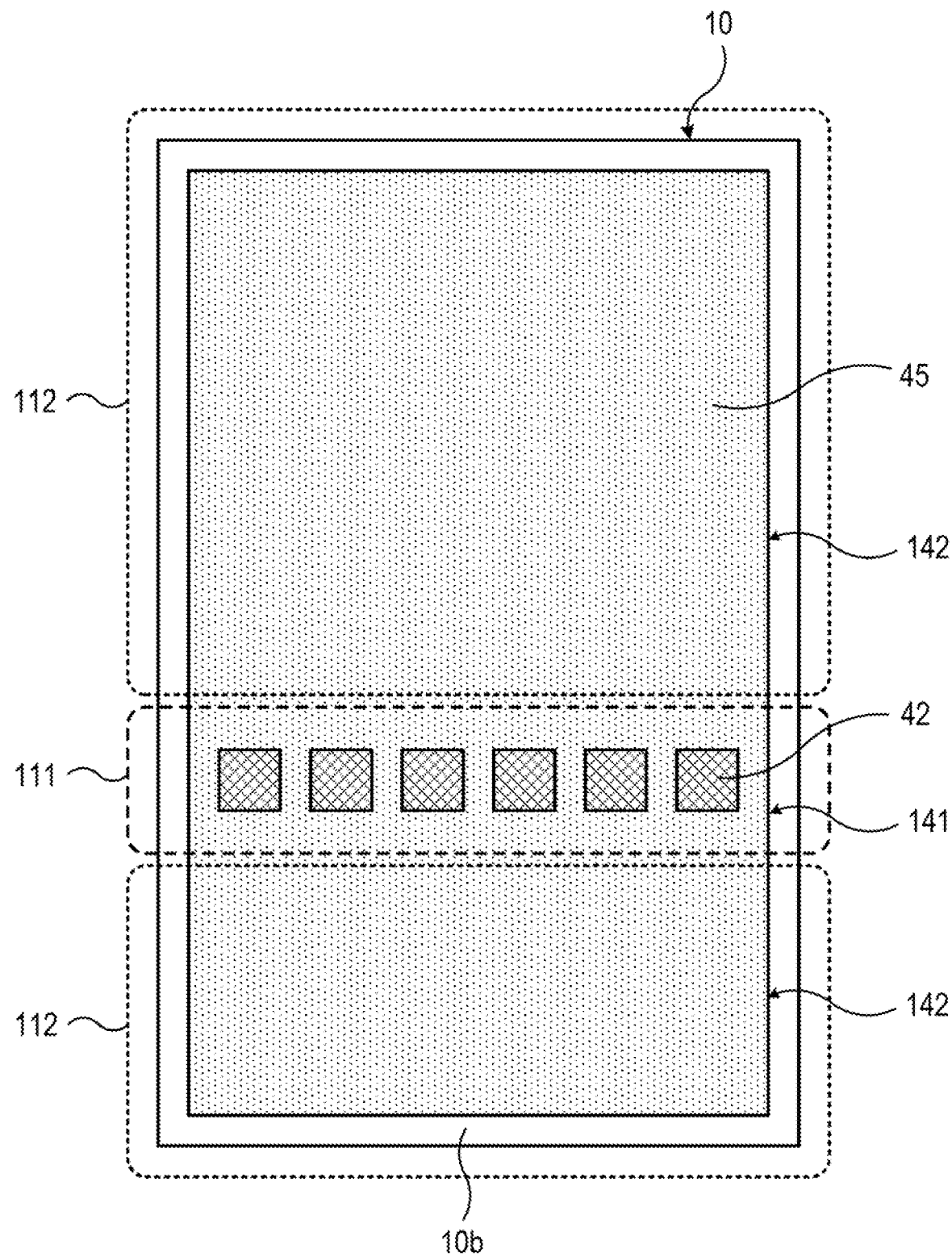
FIG. 20 is a view illustrating an example of an arrangement relationship between an antenna board and a support unit of the antenna integrated amplifier according to the fourth embodiment.

FIG. 19 is a view illustrating an example of an antenna integrated amplifier according to a fourth embodiment. FIG. 19 schematically illustrates a cross-sectional view of a major part of an example of an antenna integrated amplifier. Further, FIG. 20 is a view illustrating an example of an arrangement relationship between an antenna board and a support unit of the antenna integrated amplifier according to the fourth embodiment. FIG. 20 schematically illustrates a plan view taken along the direction of arrows XX-XX in FIG. 19. An example of the antenna integrated amplifier according to the fourth embodiment will be described with reference to FIGS. 19 and 20.

The antenna integrated amplifier 1Ba illustrated in FIG. 19 includes the antenna board 10, the radiator 20, and a support unit 30Ba interposed therebetween. The front surface 10a of the antenna board 10 is provided with the plurality of antennas 11 and the feed layer 14 electrically connected to the antennas 11 (e.g., in unit of multiple ones). The rear surface 10b of the antenna board 10 is provided with the pad 15 electrically connected to the feed layer 14 through the conductor portion 12 provided inside the board and the GND layer 16 separated from the pad 15.

Further, the front surface 10a of the antenna board 10 may be provided with the pad 17 to which the semiconductor device 80 is bonded using the bump 81. The rear surface 10b of the antenna board 10 may be provided with the pad 18 which is electrically connected to the pad 17 on the front surface 10a through the conductor portion 13 provided inside the board. Furthermore, the front surface 10a of the antenna board 10 may be provided with the connection portion 19 to which the connector 90 is connected. For example, as the semiconductor device 80, a device having, for example, functions of the baseband circuit 210, the up-converter 220, the oscillator 230, and the phase shifter 240 of the transmitter 200 (FIG. 2) is connected to the antenna board 10. Alternatively, another device having, for example, the functions of the baseband circuit 210, the up-converter 220, the oscillator 230, and the phase shifter 240 of the transmitter 200 (FIG. 2) is connected to the antenna board 10 using the connector 90.

The protective film 10c and the protective film 10d each having an opening at a predetermined position are provided respectively on the front surface 10a and the rear surface 10b of the antenna board 10. A plate-shaped member is used for the radiator 20. A metal material having good thermal conductivity is used in the radiator 20. The support unit 308a is provided on the surface 20a of the radiator 20 with the binder 100 interposed therebetween.

The support unit 308a includes the amplification module 140 which includes the portion 141 facing a portion of the antenna board 10 and the portion 142 facing another portion of the antenna board 10. The portion 141 of the amplification module 140 includes at least one (one in the example of FIG. 19 in the cross-sectional view) amplifier 42, and the portion 142 of the amplification module 140 is provided continuously to the portion 141 including the amplifier 42. Furthermore, the support unit 30Ba includes the bump 60 provided on the surface 140a of the amplification module 140.

For example, as illustrated in FIG. 20, the portion 141 including the amplifier 42 of the amplification module 140 is located to face the predetermined region 111 of the rear surface 10b on the GND layer 16 side of the antenna board 10. The portion 142 of the amplification module 140 is located to face the region 112 different from the region 111 of the rear surface 10b of the antenna board 10. The portion 141 and the portion 142 of the amplification module 140 are continuous to each other.

Moreover, the arrangement of the portion 141 and the portion 142 of the amplification module 140 illustrated in FIG. 20 is merely an example, and the disclosure is not limited thereto. The portion 141 and the portion 142 are arranged according to the number or planar size of amplifiers 42 included in the amplification module 140, the positions of one or more amplifiers 42 with respect to the rear surface 10b of the antenna board 10, and the like.

As illustrated in FIG. 19, the amplification module 140 is disposed on the radiator 20 with the binder 100 interposed therebetween in which various types of bonding materials such as a solder, a brazing material, conductive paste, or a resin are used. In order to efficiently transfer heat generated in the amplifier 42 of the amplification module 140 to the radiator 20, a bonding material having good thermal conductivity may be used in the binder 100. In order to connect the amplifier 42 of the amplification module 40 to the radiator 20 through a GND, a bonding material having good electrical conductivity may be used in the binder 100.

For example, a solder material is used in the bump 60 provided on the amplification module 140. The bump 60 provided on the amplification module 140 is bonded to the pad 15 (or the pad 18) exposed from the opening in the protective film 10d of the antenna board 10 and to a portion of the GND layer 16. Therefore, the antenna board 10 is supported by the amplification module 140 and the bump 60. Furthermore, the amplification module 140 is electrically connected to the antenna board 10 through the bump 60. The amplifier 42 (the terminal 43 thereof) of the amplification module 140 is electrically connected to the antenna 11 of the antenna board 10 through the conductor portion 44, the bump 60, the pad 15, the conductor portion 12, and the feed layer 14.

In the antenna integrated amplifier 1Ba, the antenna board 10 is supported by the amplification module 140 which includes the portion 141 including the amplifier 42 and the portion 142 continuous to the portion 141 and the bump 60 on the surface 140a of the amplification module 140, thereby being stably held with respect to the radiator 20.

Figure 21:
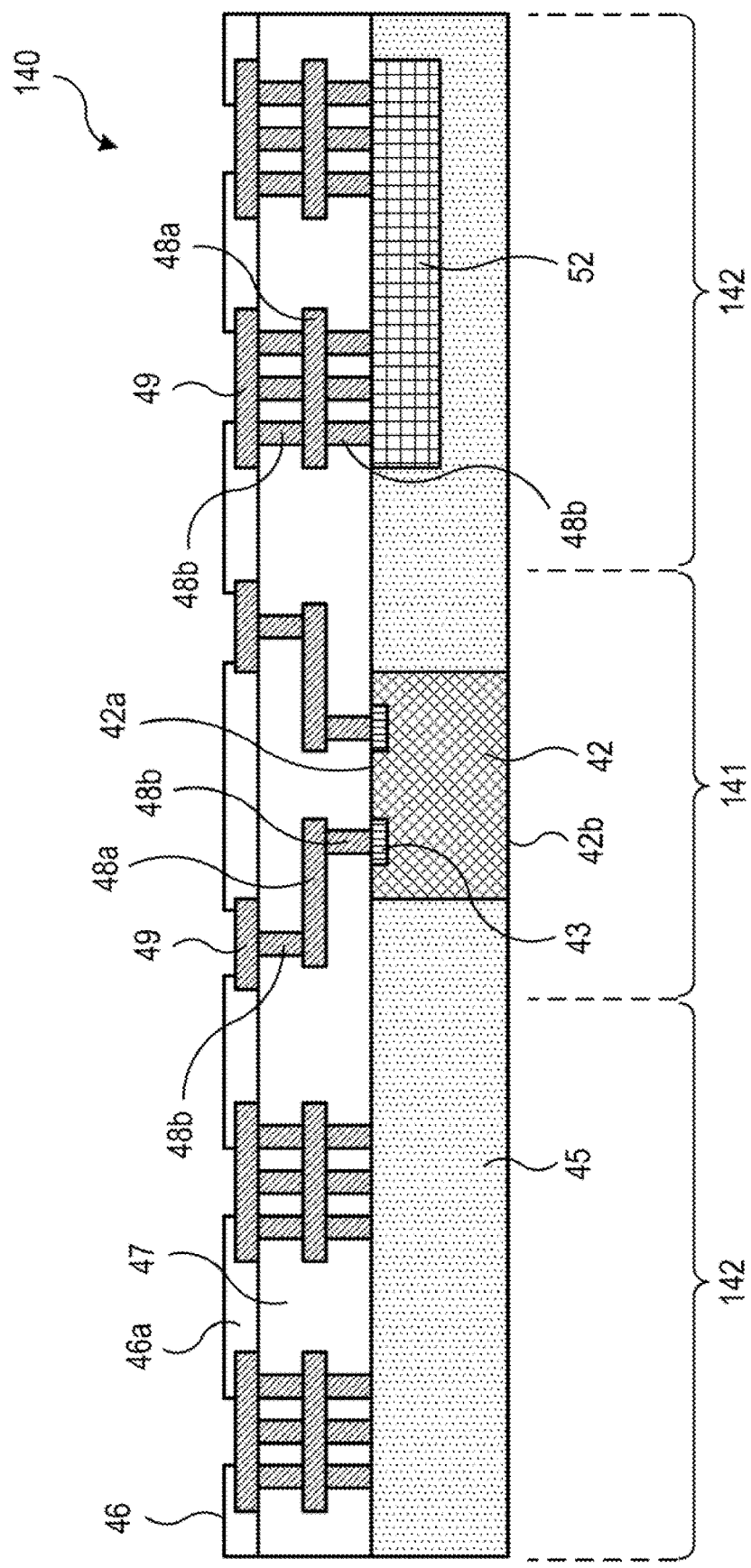
FIG. 21 is a view (part 1) illustrating an example of an amplification module according to the fourth embodiment.
Figure 22:
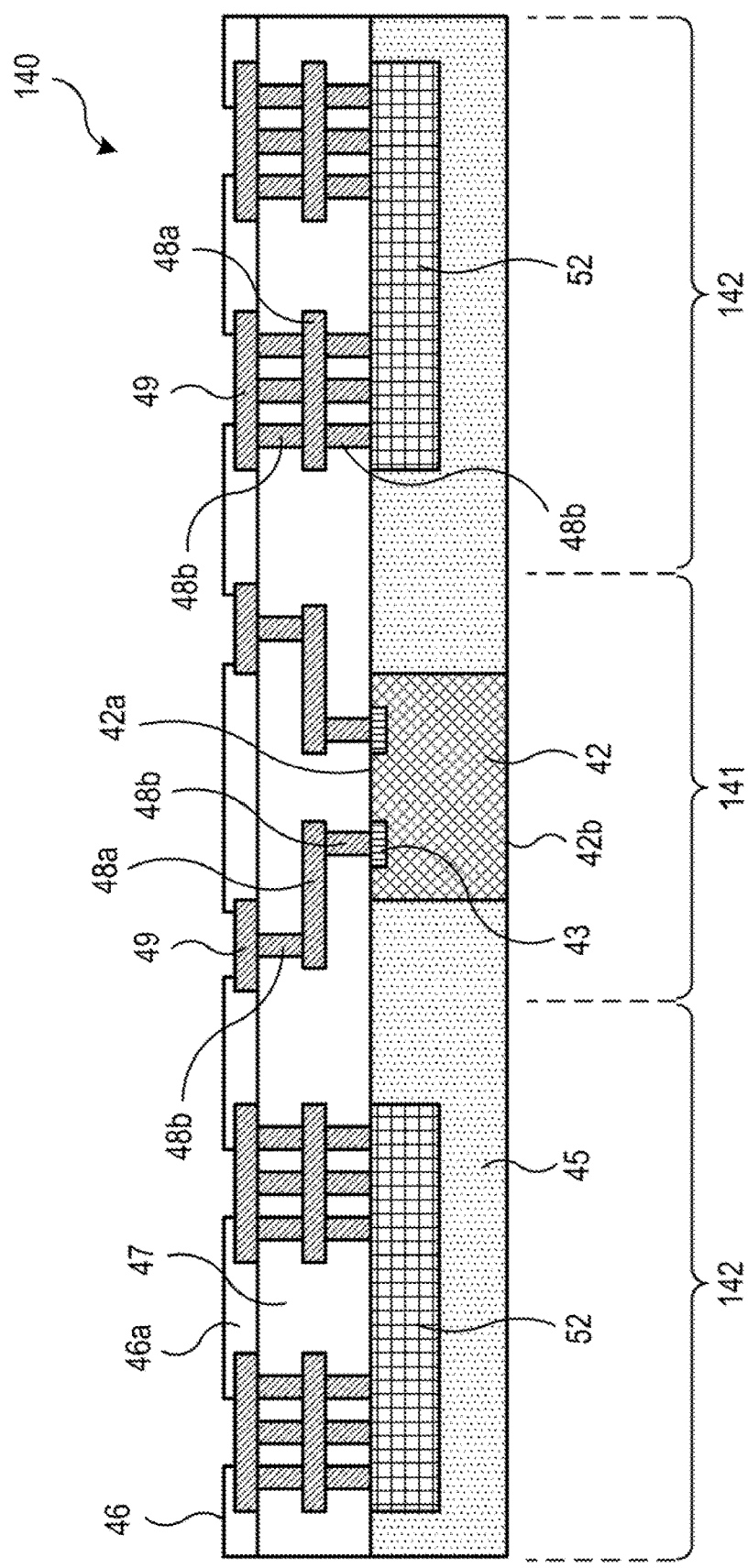
FIG. 22 is a view (part 2) illustrating an example of the amplification module according to the fourth embodiment.
Figure 23:
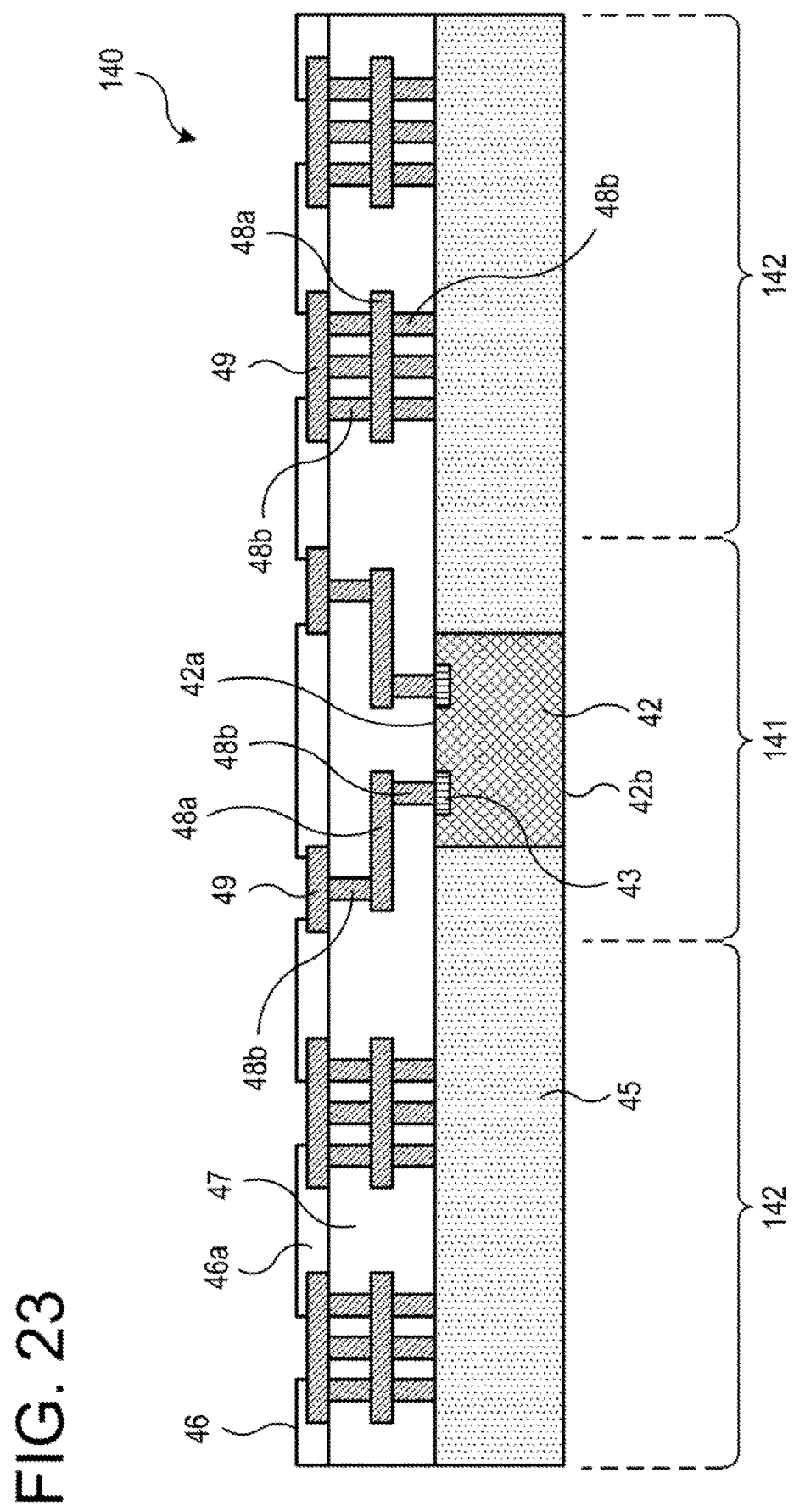
FIG. 23 is a view (part 3) illustrating an example of the amplification module according to the fourth embodiment.

The amplification module 140 will be further described. FIGS. 21 to 23 are views illustrating examples of the amplification module according to the fourth embodiment. FIGS. 21 to 23 schematically illustrate cross-sectional views of major parts of examples of the amplification module.

For example, the amplification module 140 as illustrated in FIG. 21 is used in the antenna integrated amplifier 1Ba (FIG. 19). The amplification module 140 illustrated in FIG. 21 includes the amplifier 42, the chip 52, the resin layer 45, and the redistribution layer 46. The amplification module 140 illustrated in FIG. 21 includes the portion 141 including at least one (one in the example of FIG. 21 in the cross-sectional view) amplifier 42 and the portion 142 provided continuously to the portion 141 and including at least one (one in the example of FIG. 21 in the cross-sectional view) chip 52.

For example, a semiconductor device including, for example, a GaN-HEMT and the like in an amplification circuit is used for the amplifier 42. The terminal 43 is provided on the front surface 42a of the amplifier 42. The amplifier 42 is embedded in the resin layer 45 so that the terminal 43 on the front surface 42a is exposed. The amplifier 42 is embedded in the resin layer 45 so that, for example, the rear surface 42b opposite to the front surface 42a on which the terminal 43 is provided is exposed.

For example, a dummy chip is used for the chip 52. A chip using a material having rigidity higher than that of the resin layer 45, for example, various types of chips formed of a metal or ceramic are used for the chip 52. Such a chip 52 is embedded in the resin layer 45 along with the amplifier 42.

Various types of resin materials are used in the resin layer 45. For example, an epoxy resin, a phenol resin, or a polyimide resin may be used as a resin material of the resin layer 45. The resin material of the resin layer 45 may contain an insulating filler such as silicon oxide.

The redistribution layer 46 includes the insulating layer 47, the wire 48a and the via 48b (conductor portion) provided inside the insulating layer 47, and the pad 49 and the protective film 46a provided on a surface of the insulating layer 47. Various types of insulating materials are used in the insulating layer 47. For example, a resin material such as a polyimide resin, an epoxy resin, a phenol resin, or a polybenzoxazole resin is used as an insulating material of the insulating layer 47. Various types of conductor materials are used in the wire 48a, the via 48b, and the pad 49. For example, a metal material such as Cu or Al may be used as a conductor material of the wire 48a, the via 48b, and the pad 49. For example, an insulating material such as a solder resist is used in the protective film 46a.

The wire 48a, the via 48b, and the pad 49 of the redistribution layer 46 are connected to the terminal 43 of the amplifier 42 included in the portion 141 of the amplification module 140. The portion 141 of the amplification module 140 including the amplifier 42 has a structure in which the terminal 43 of the amplifier 42 is surrounded by the wire 48a and the via 48b in the redistribution layer 46 and the pad 49 is located outside the amplifier 42 in the transverse direction. However, the number and positions of wires 48a and vias 48b, the number and positions of pads 49, and the number and positions of openings in the protective film 46a in the portion 141 of the amplification module 140 are not limited to those illustrated in FIG. 21.

A stack of the wire 48a and the via 48b extending upward from the chip 52 is provided on the chip 52 embedded in the portion 142 of the amplification module 140, and the pad 49 as an uppermost layer conductor is provided on the stack. In a portion including the chip 52, for example, the stack of the wire 48a and the via 48b and the pad 49 thereon are provided to correspond to at least one location (two locations in the example of FIG. 21 in the cross-sectional view) of the chip 52 included in the portion 142. Further, in the portion 142 not including the chip 52 among the portion 142 of the amplification module 140, a stack of the wire 48a and the via 48b extending upward from the resin layer 45 is provided on the resin layer 45, and the pad 49 as an uppermost layer conductor is provided on the stack. In the portion 142 not including the chip 52, for example, such a stack of the wire 48a and the via 48b and the pad 49 thereon are provided to correspond to at least one location (two locations in the example of FIG. 21 in the cross-sectional view) of the resin layer 45. However, the number and positions of stacks of the wire 48a and the via 48b, the number and positions of pads 49, and the number and positions of openings in the protective film 46a in the portion 142 of the amplification module 140 are not limited to those illustrated in FIG. 21.

Moreover, the resin layer 45 and the redistribution layer 46 of the amplification module 140 illustrated in FIG. 21 correspond to the package 41 (FIG. 18) described in the third embodiment. Among the wire 48a, the via 48b, and the pad 49 provided on the redistribution layer 46 of the amplification module 140 illustrated in FIG. 21, one connected to the amplifier 42 included in the portion 141 corresponds to the conductor portion 44 (FIG. 18) described in the first embodiment.

The amplification module 140 used in the antenna integrated amplifier 1Ba (FIG. 19) may have a configuration as illustrated in FIG. 22 or 23, in addition to the configuration as illustrated in FIG. 21. The amplification module 140 illustrated in FIG. 22 has a configuration in which the chip 52 is further provided in the portion 142 different from the portion 141 including the amplifier 42 of the amplification module 140 illustrated in FIG. 21. When the chip 52 is included in the portion 142 of the amplification module 140 (FIGS. 21 and 22), the pad 49 to which the bump 60 supporting the antenna board 10 is bonded is supported on the chip 52 by a stack of the wire 48a and the via 48b. Therefore, when the chip 52 is included in the portion 142 of the amplification module 140, the antenna board 10 is more stably supported than a case where the chip 52 is not included. For example, when the chip 52 which stably supports the antenna board 10 as described above is provided at a position inside the amplification module 140 corresponding to the vicinity of the edge of the antenna board 10, for example, the inclination of the antenna board 10 is effectively suppressed.

Further, the amplification module 140 illustrated in FIG. 23 has a configuration in which the chip 52 is not provided in the portion 142 different from the portion 141 including the amplifier 42. According to the amplification module 140 illustrated in FIG. 23, the cost of the support module 50 and the antenna integrated amplifier 1Ba may be reduced since no chip 52 is used.

In the amplification module 140 including the chip 52 as illustrated in FIGS. 21 and 22, a configuration in which the rear surface 52b of the chip 52 is exposed from the resin layer 45 may be adopted according to the example of FIG. 16. Further, in the amplification module 140 as illustrated in FIGS. 21 to 23, a configuration in which a through-conductor (corresponding to the through-conductor 53) penetrating the resin layer 45 and the wire 48a, the via 48b, and the pad 49 which are connected to the through-conductor are provided may be adopted according to the example of FIG. 17.

By adopting these configurations, in the antenna integrated amplifier 1Ba, electrical connection (GND connection) and thermal connection are possible between the antenna board 10 and the radiator 20 through the chip 52 or the through-conductor penetrating the resin layer 45.

The amplification module 140 having the configuration as illustrated in FIGS. 21 to 23, for example, is formed, for example, using the WLP technology. An example of a method of forming the amplification module 140 will be described with reference to FIGS. 24A to 24D.

FIGS. 24A to 24D are views illustrating an example of a method of forming the amplification module according to the fourth embodiment. FIGS. 24A to 24D schematically illustrate cross-sectional views of major parts of a process of forming the amplification module, respectively.

Here, the formation of the amplification module 140 which includes the portion 141 including the amplifier 42, the portion 142 including the chip 52, and the portion 142 not including the chip 52 as illustrated in FIG. 21 will be described by way of example.

Figure 24A:
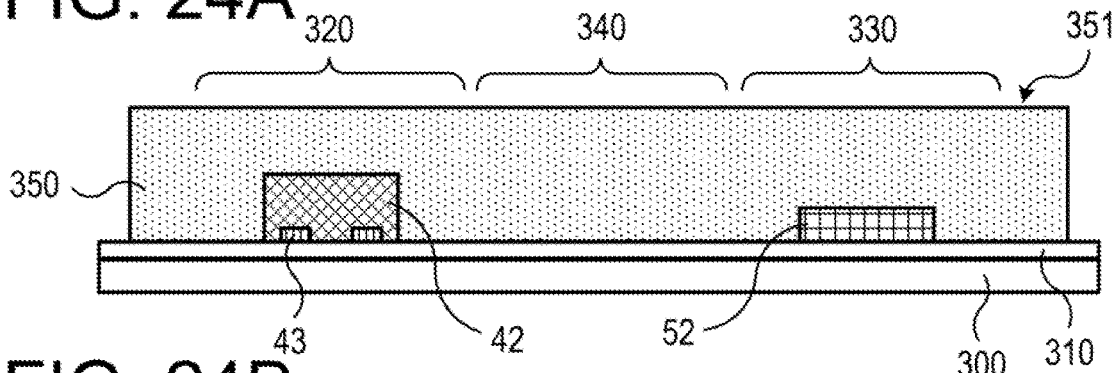
FIGS. 24A to 24D are views illustrating an example of a method of forming the amplification module according to the fourth embodiment.

First, as illustrated in FIG. 24A, the amplifier 42 is disposed in the region 320 of the adhesive layer 310 provided on the support substrate 300 which forms the portion 141 including the amplifier 42, and the chip 52 is disposed in the region 330 which forms the portion 142 including the chip 52. The amplifier 42 and the chip 52 are adhered to and fixed on the adhesive layer 310. Neither the amplifier 42 nor the chip 52 is disposed in the region 340 of the adhesive layer 310 provided on the support substrate 300 which forms the portion 142 including neither the amplifier 42 nor the chip 52.

After the arrangement of the amplifier 42 and the chip 52, as illustrated in FIG. 24A, the resin layer 350 is formed on the region 320, the region 330 and the region 340 of the support substrate 300 by molding and the like. Therefore, the pseudo wafer 351 in which the amplifier 42 and the chip 52 are embedded in the resin layer 350 is formed on the adhesive layer 310 provided on the support substrate 300.

Figure 24B:
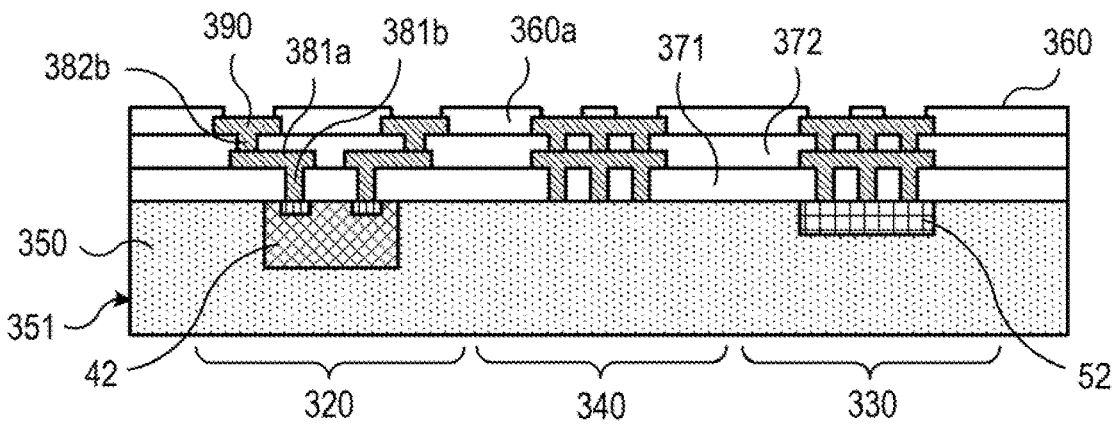

After the formation of the resin layer 350, the pseudo wafer 351 in which the amplifier 42 and the chip 52 are embedded in the resin layer 350 is peeled off from the adhesive layer 310 provided on the support substrate 300. Then, as illustrated in FIG. 24B, the redistribution layer 360 is formed on the surface of the pseudo wafer 351 peeled off from the adhesive layer 310. For example, according to the example of FIGS. 12C to 13B, the insulating layer 371, the via 381b, and the wire 381a in a first layer are formed, and the second insulating layer 372, the via 382b, and the pad 390 in a second layer are formed. Finally, the protective film 360a is formed. Therefore, the redistribution layer 360 is formed on the pseudo wafer 351.

Figure 24C:
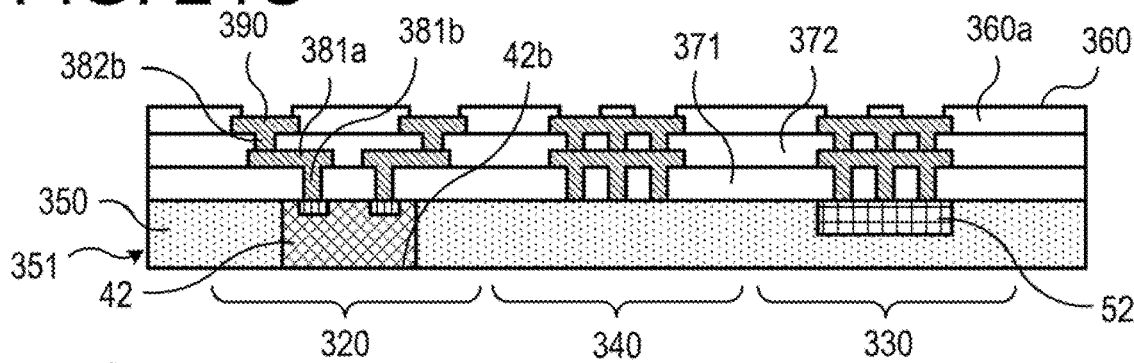

After the formation of the redistribution layer 360, as illustrated in FIG. 24C, the resin layer 350 of the pseudo wafer 351 is back-ground so that the rear surface 42b of the embedded amplifier 42 is exposed. Moreover, the back-grinding that exposes the rear surface 42b of the amplifier 42 may be performed before the formation of the redistribution layer 360 as well as after the formation of the redistribution layer 360.

After the formation of the pseudo wafer 351 as illustrated in FIG. 24C including the back-ground resin layer 350 and the redistribution layer 360 provided thereon, dicing is performed at an outer edge position of the region 320, the region 330, and the region 340 thereof. Therefore, the amplification module 140 as illustrated in FIG. 24D is formed.

Figure 24D:
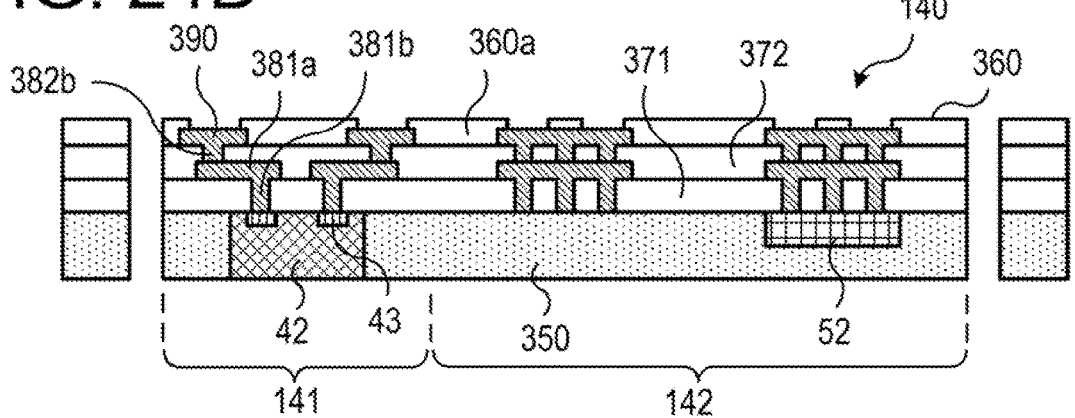

Moreover, the resin layer 350 and the redistribution layer 360 of the amplification module 140 illustrated in FIG. 24D correspond to the resin layer 45 and the redistribution layer 46 of the amplification module 140 having the configuration as illustrated in FIG. 21, respectively. Here, the insulating layers 371 and 372 illustrated in FIG. 24D correspond to the insulating layer 47 illustrated in FIG. 21. The vias 381b and 382b illustrated in FIG. 24D correspond to the via 48b illustrated in FIG. 21. The wire 381a illustrated in FIG. 24D corresponds to the wire 48a illustrated in FIG. 21. The pad 390 illustrated in FIG. 24D corresponds to the pad 49 illustrated in FIG. 21. The protective film 360a illustrated in FIG. 24D corresponds to the protective film 46a Illustrated in FIG. 21.

Here, the formation of the amplification module 140 having the configuration as illustrated in FIG. 21 is given by way of example, but the amplification module 140 having the configuration as illustrated in FIGS. 22 and 23 may also be formed according to an example of the method as illustrated in FIGS. 24A to 24D.

In the amplification module 140 formed by the WLP process as described above, the portion 141 including the amplifier 42 and the portion 142 continuous to the portion 141 are formed to have the same or equivalent thickness. In the antenna integrated amplifier 1Ba illustrated in FIG. 19, the antenna board 10 is supported with respect to the radiator 20 by the amplification module 140 and the bump 60 provided on the surface 140a thereof. By using the amplification module 140 formed by the method as described above, the inclination of the antenna board 10 with respect to the radiator 20 and the uneven load applied to the bump 60 due to the inclination may be suppressed, and thus, the antenna board 10 may be stably held.

Figure 25A:
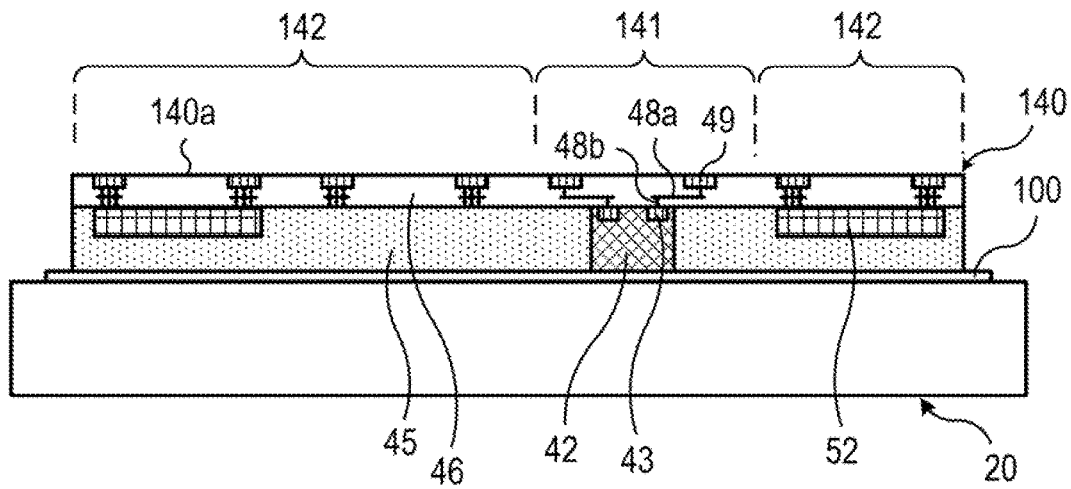
FIGS. 25A to 25C are views illustrating an example of a method of assembling the antenna integrated amplifier according to the fourth embodiment.
Figure 25B:
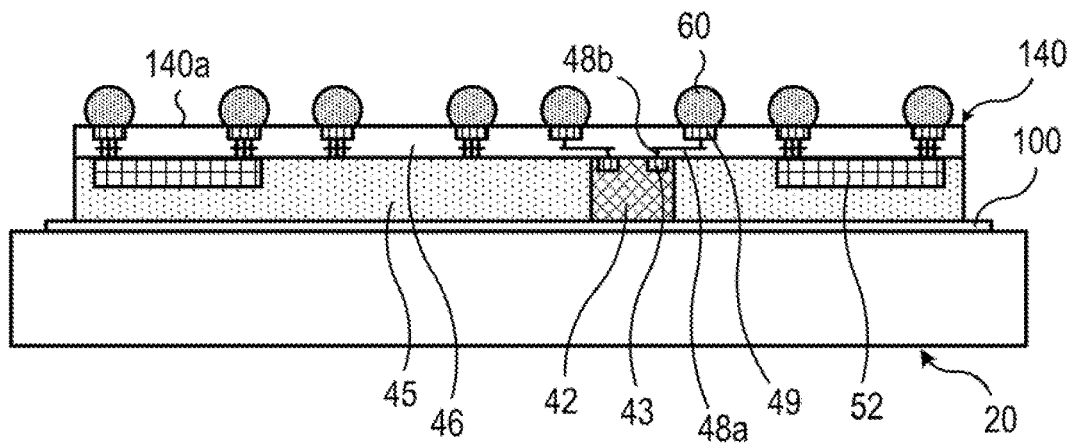
Figure 25C:
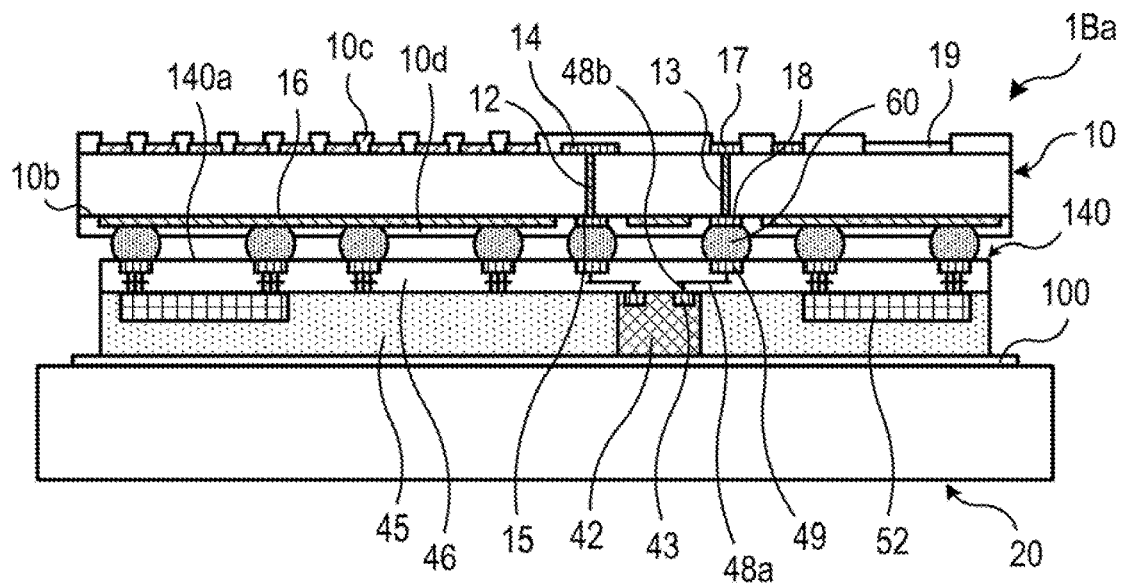

FIGS. 25A to 25C are views illustrating an example of a method of assembling the antenna integrated amplifier according to the fourth embodiment. FIGS. 25A to 25C schematically illustrate cross-sectional views of major parts of a process of assembling the antenna integrated amplifier.

Here, an assembling example using the amplification module 140 which includes the portion 141 including the amplifier 42, the portion 142 including the chip 52, and the portion 142 not including the chip 52 is illustrated. First, as illustrated in FIG. 25A, the binder 100 before being cured is provided on the radiator 20, and the amplification module 140 is provided thereon. The binder 100 provided with the amplification module 140 is cured by a method such as heating. Therefore, as illustrated in FIG. 25A, the amplification module 140 is bonded to and fixed on the radiator 20 by the binder 100.

Next, as illustrated in FIG. 25B, the bumps 60 are provided on the pads 49 of the amplification module 140 bonded to the radiator 20 with the binder 100. For example, a solder ball or solder paste is formed as the bump 60 on the pad 49. Alternatively, the formed solder ball or solder paste is further melted by heating and is solidified by cooling so that the bump 60 is formed. FIG. 25B illustrates, as an example, a ball-shaped or substantially ball-shaped bump 60 obtained through such heating and cooling.

When heating is performed at the time of formation of the bump 60, the type of a solder material used in the bump 60 is adjusted to suppress the position of the amplification module 140 from being changed due to the melting of the binder 100 by heating. Alternatively, the type of a bonding material used in the binder 100 is adjusted. For example, a solder material having a melting point higher than that of the bump 60 may be used in the binder 100, or Ag paste may be used in the binder 100.

Next, as illustrated in FIG. 25C, the antenna board 10 is bonded to the bumps 60 of the amplification module 140. The antenna board 10 is disposed such that the rear surface 10b on the GND layer 16 side faces the radiator 20 and the amplification module 140 provided thereon. The protective film 10d having openings at positions corresponding to the bumps 60 of the amplification module 140 is provided in advance on the rear surface 10b of the antenna board 10. The bumps 60 are in contact with the pad 15, the pad 18, and the GND layer 16 exposed from the protective film 10d of the antenna board 10 disposed to face the radiator 20 and the amplification module 140.

In a state where the bumps 60 of the amplification module 140 are in contact with the pad 15, the pad 18, and the GND layer 16 of the antenna board 10, the bumps 60 are melted by heating and are solidified by cooling. Therefore, as illustrated in FIG. 25C, the bumps 60 of the amplification module 140 are bonded to the pad 15, the pad 18, and the GND layer 16 of the antenna board 10.

In the bonding of the bumps 60 and the antenna board 10, the type of a solder material used in the bumps 60 is adjusted to suppress the position of the amplification module 140 from being changed due to the melting of the binder 100 by heating at that time. Alternatively, the type of a bonding material used in the binder 100 is adjusted. For example, a solder material having a melting point higher than that of the bump 60 may be used in the binder 100, or Ag paste may be used in the binder 100.

The antenna integrated amplifier 1Ba is assembled by the method as illustrated in FIGS. 25A to 25C. In the antenna integrated amplifier 1Ba, the antenna board 10 is supported by the amplification module 140 and the bumps 60 which are interposed between the antenna board 10 and the radiator 20. In the antenna integrated amplifier 1Ba, a portion of the antenna board 10 is supported by the portion 141 including the amplifier 42 electrically connected to the antenna 11, and another portion of the antenna board 10 is supported by the portion 142 which is continuous to the portion 141 and has the same thickness as or a thickness equivalent to that of the portion 141. Therefore, the inclination of the antenna board 10 with respect to the radiator 20 and the uneven load applied to the bumps 60 due to the inclination are suppressed, and thus, the antenna board 10 is stably held.

As described above, according to the antenna integrated amplifier 1Ba described in the fourth embodiment, the antenna board 10 is supported by the amplification module 140 and the bumps 60. Therefore, the antenna board 10 is stably held with respect to the radiator 20, and the antenna integrated amplifier 1Ba having high connection reliability between the antenna board 10 and the amplifier 42 is realized.

The antenna integrated amplifiers 1A, 1Aa, 18, and 1Ba, and the like described in the first to fourth embodiments may be applied to the transmitter 200 as illustrated in FIGS. 2 and 3. Besides, the antenna integrated amplifiers 1A, 1Aa, 1B, and 1Ba, and the like described in the first to fourth embodiments may also be applied to a receiver. In this case, a signal (analog signal) received by the antenna 11 of the antenna board 10 is input to and amplified by the amplifier 42 such as a low noise amplifier provided in the antenna integrated amplifiers 1A, 1Aa, 18, and 1Ba, and the like. Then, the signal amplified by the amplifier 42 is converted (down-converted) to a signal of a predetermined frequency by a down converter, and is converted to data (digital signal).

A transmitter or receiver (communication device) in which the amplifier 42 of the antenna integrated amplifiers 1A, 1Aa, 18, and 1Ba, and the like described in the first to fourth embodiments is connected to a predetermined converter such as an up- or down-converter or a DA or AD converter is realized. In the antenna integrated amplifiers 1A, 1Aa, 1B, and 1Ba, and the like described in the first to fourth embodiments, the bump 60 and the bump 70 are used, or the bump 60 is used for connection between the antenna board 10 and the amplifier 42, so that the connection distance between the antenna board 10 and the amplifier 42 is reduced. Furthermore, in the antenna integrated amplifiers 1A, 1Aa, 18, and 1Ba, and the like described in the first to fourth embodiments, the antenna board 10 is stably held with respect to the radiator 20 by the amplification module 40 and the support module 50 or by the amplification module 140. Therefore, a high-performance and high-quality transmitter or receiver in which the transmission loss of signals and hence deterioration in communication quality or an increase in power consumption are suppressed, may be realized.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. An antenna integrated amplifier comprising:
 a board configured to include an antenna;
 a radiator that faces the board;
 a first supporter interposed between the board and the radiator to support the board with respect to the radiator, and configured to include an amplifier to amplify a signal communicated by the antenna;
 a first bump interposed between the board and the first supporter to be electrically coupled to the antenna and the amplifier;
 a second supporter interposed between the board and the radiator to support the board with respect to the radiator; and
 a second bump interposed between the board and the second supporter.

2. The antenna integrated amplifier according to claim 1, wherein the first supporter includes:
 a first resin layer provided over a surface of the radiator that faces the board, the amplifier being embedded in the first resin layer; and
 a first redistribution layer provided over the first resin layer and over a board side of the amplifier, and configured to include a first pad to be coupled to the first bump and a first conductor to be coupled to the first pad and the amplifier, and
 wherein the second supporter includes:
 a second resin layer provided over the surface of the radiator; and
 a second redistribution layer provided over a board side of the second resin layer, and configured to include a second pad to be coupled to the second bump and a second conductor located over a radiator side of the second pad and coupled to the second pad.

3. The antenna integrated amplifier according to claim 2, wherein, in the first supporter, a surface of the amplifier on a radiator side opposite to a first redistribution layer side is exposed from the first resin layer.

4. The antenna integrated amplifier according to claim 2, wherein the second supporter includes a chip embedded in the second resin layer,
   wherein the second redistribution layer is provided over the second resin layer and over a board side of the chip, and
   wherein the second conductor is coupled to the second pad and the chip.

5. The antenna integrated amplifier according to claim 4, wherein, the second supporter, a surface of the chip on a radiator side opposite to a second redistribution layer side is exposed from the second resin layer.

6. The antenna integrated amplifier according to claim 2, further comprising:
   a third bump interposed between the board and the second supporter,
   wherein the second supporter includes:
   a third conductor that penetrates the second resin layer;
   a third pad provided over the second redistribution layer and to be coupled to the third bump; and
   a fourth conductor provided in the second redistribution layer coupled to the third pad and the third conductor.

7. The antenna integrated amplifier according to claim 1, wherein the first supporter and the second supporter are separated from each other.

8. The antenna integrated amplifier according to claim 1, wherein the first supporter and the second supporter are continuous to each other.

9. The antenna integrated amplifier according to claim 1, wherein a distance from a surface of the second supporter to a surface of the radiator is equivalent to a distance from a surface of the first supporter to the surface of the radiator.

10. The antenna integrated amplifier according to claim 1, wherein
    the first supporter faces a portion of the board, and
    the second supporter faces another portion of the board different from the portion of the board.

11. A communication device comprising:
    a converter configured to generate a baseband signal and to convert the baseband signal into a transmitted signal of a predetermined frequency;
    a board configured to include an antenna;
    a radiator that faces the board;
    a first supporter interposed between the board and the radiator to support the board with respect to the radiator, and configured to include an amplifier to amplify the transmitted signal communicated by the antenna;
    a first bump interposed between the board and the first supporter to be electrically coupled to the antenna and the amplifier;
    a second supporter interposed between the board and the radiator to support the board with respect to the radiator; and
    a second bump interposed between the board and the second supporter.

* * * * *